(12) United States Patent
Uemura et al.

(10) Patent No.: US 10,167,537 B2
(45) Date of Patent: Jan. 1, 2019

(54) ELECTRONIC APPARATUS AND METHOD FOR MANUFACTURING THE SAME

(71) Applicant: FUJITSU LIMITED, Kawasaki-shi, Kanagawa (JP)

(72) Inventors: Taiki Uemura, Kawasaki (JP); Kozo Shimizu, Atsugi (JP); Seiki Sakuyama, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 218 days.

(21) Appl. No.: 14/960,638

(22) Filed: Dec. 7, 2015

(65) Prior Publication Data

US 2016/0212849 A1    Jul. 21, 2016

(30) Foreign Application Priority Data

Jan. 16, 2015  (JP) .................................. 2015-006642

(51) Int. Cl.
| | | |
|---|---|---|
| H05K 7/00 | (2006.01) | |
| C22C 28/00 | (2006.01) | |
| B23K 35/26 | (2006.01) | |
| C22C 13/00 | (2006.01) | |
| B23K 35/30 | (2006.01) | |

(Continued)

(52) U.S. Cl.
CPC .............. *C22C 28/00* (2013.01); *B23K 35/26* (2013.01); *B23K 35/262* (2013.01); *B23K 35/302* (2013.01); *B23K 35/3006* (2013.01); *B23K 35/40* (2013.01); *C22C 13/00* (2013.01); *H01L 24/00* (2013.01); *H05K 3/3463* (2013.01); *H05K 3/3436* (2013.01); *H05K 2201/10378* (2013.01); *H05K 2201/10674* (2013.01)

(58) Field of Classification Search
CPC .. B23K 35/26; B23K 35/262; B23K 35/3006; B23K 35/302; B23K 35/40; C22C 13/00; C22C 28/00; H01L 24/00; H05K 2201/10378; H05K 2201/10674; H05K 3/3436; H05K 3/3463
See application file for complete search history.

(56) References Cited

U.S. PATENT DOCUMENTS

| | | | | |
|---|---|---|---|---|
| 5,520,752 A | * | 5/1996 | Lucey, Jr. ............ | B23K 35/262 148/400 |
| 6,590,287 B2 | * | 7/2003 | Ohuchi ................. | H01L 21/563 228/180.22 |

(Continued)

FOREIGN PATENT DOCUMENTS

| | | |
|---|---|---|
| JP | 61-148774 | 7/1986 |
| JP | 9-155586 | 6/1997 |

(Continued)

OTHER PUBLICATIONS

JPOA—Office Action of Japanese Patent Application No. 2015-6642 dated Aug. 28, 2018 with Full Machine Translation.

*Primary Examiner* — Yuriy Semenenko
(74) *Attorney, Agent, or Firm* — Fujitsu Patent Center

(57) ABSTRACT

An electronic apparatus includes: a first electronic component including a first electrode; solder on the first electrode; and a phase containing In, Ag, and Cu, the phase being dispersed and included in the solder.
And a method for manufacturing an electronic apparatus, the method includes: forming solder on a first electrode of a first component, the solder including a phase containing In, Ag, and Cu, the phase being dispersed in the solder.

10 Claims, 17 Drawing Sheets

(51) Int. Cl.
  *B23K 35/40*   (2006.01)
  *H01L 23/00*   (2006.01)
  *H05K 3/34*    (2006.01)

(56) References Cited

U.S. PATENT DOCUMENTS

| | | | | |
|---|---|---|---|---|
| 2010/0307823 | A1* | 12/2010 | Kawamata | B23K 35/26 |
| | | | | 174/84 R |
| 2011/0070122 | A1* | 3/2011 | Tsao | B22F 3/18 |
| | | | | 420/502 |
| 2011/0095423 | A1* | 4/2011 | Ohashi | H01L 21/563 |
| | | | | 257/737 |
| 2016/0163668 | A1* | 6/2016 | Hine | H01L 24/17 |
| | | | | 174/257 |

FOREIGN PATENT DOCUMENTS

| | | |
|---|---|---|
| JP | 2013-22619 | 2/2013 |
| JP | 2013-233577 | 11/2013 |
| JP | 2013233577 | * 11/2013 |

* cited by examiner

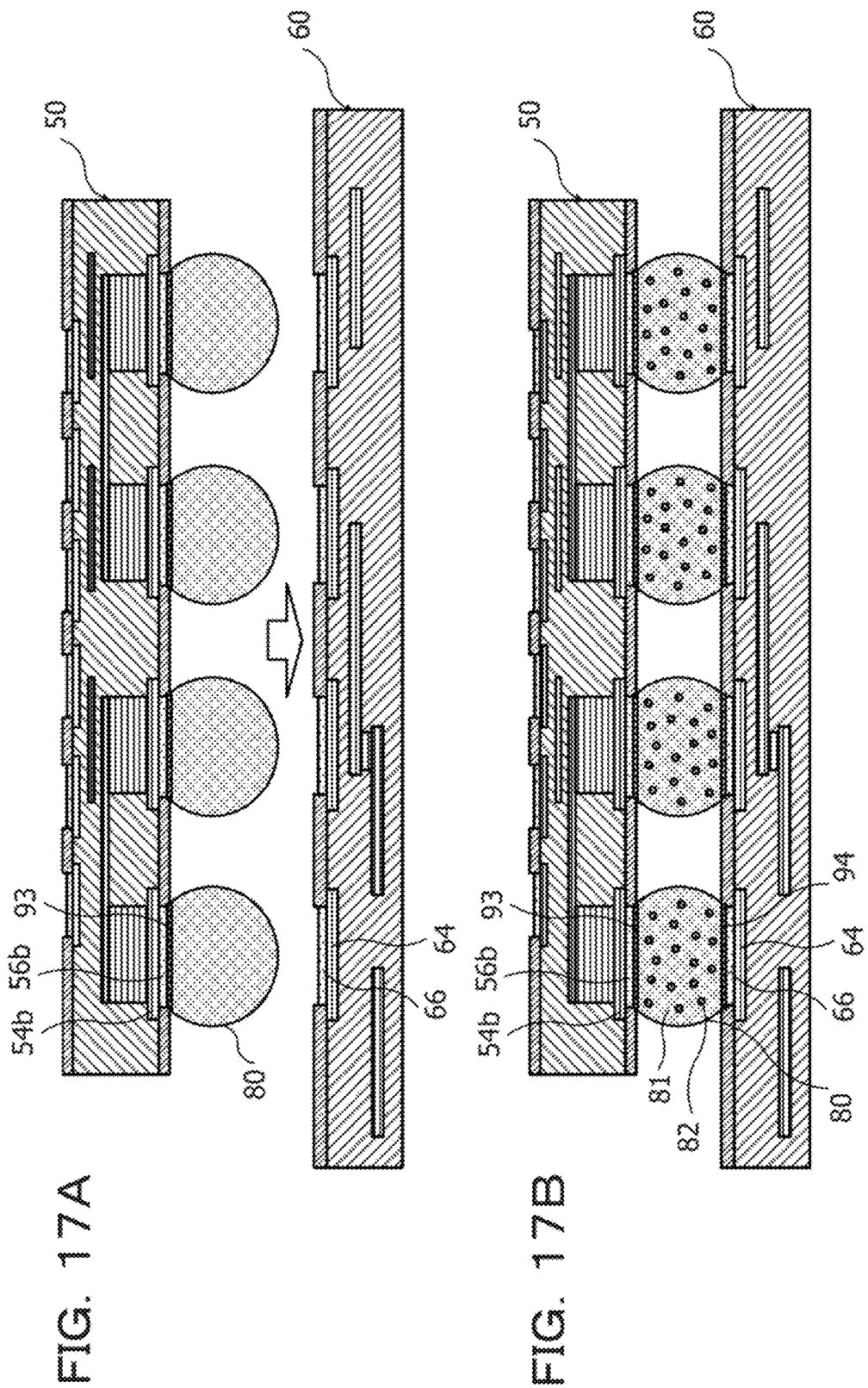

ELECTRONIC APPARATUS AND METHOD FOR MANUFACTURING THE SAME

CROSS-REFERENCE TO RELATED APPLICATION

This application is based upon and claims the benefit of priority of the prior Japanese Patent Application No. 2015-006642, filed on Jan. 16, 2015, the entire contents of which are incorporated herein by reference.

FIELD

The embodiments discussed herein are related to an electronic apparatus and a method for manufacturing the electronic apparatus.

BACKGROUND

Techniques for joining electrodes to one another with solder are known. Techniques in which solder having a relatively melting point, that is, low-melting-point solder, such as solder containing indium (In) or solder produced by adding silver (Ag) or the like to solder containing In is used for performing joining are known.

Low-melting-point solder is capable of being melted at a low temperature. However, if an internal structure (i.e., microstructure) having good mechanical properties is not formed when the low-melting-point solder melts and solidifies, it is difficult to form a solder joint having high durability to withstand external forces and stresses.

The followings are reference documents.
[Document 1] Japanese Laid-open Patent Publication No. 2013-233577, and
[Document 2] Japanese Laid-open Patent Publication No. 61-148774.

SUMMARY

According to an aspect of the invention, an electronic apparatus includes: a first electronic component including a first electrode; solder on the first electrode; and a phase containing In, Ag, and Cu, the phase being dispersed and included in the solder.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 17A and 17B are diagrams illustrating an example of a method for manufacturing an electronic apparatus according to a third embodiment (Part 2).

DESCRIPTION OF EMBODIMENTS

Figure 1:
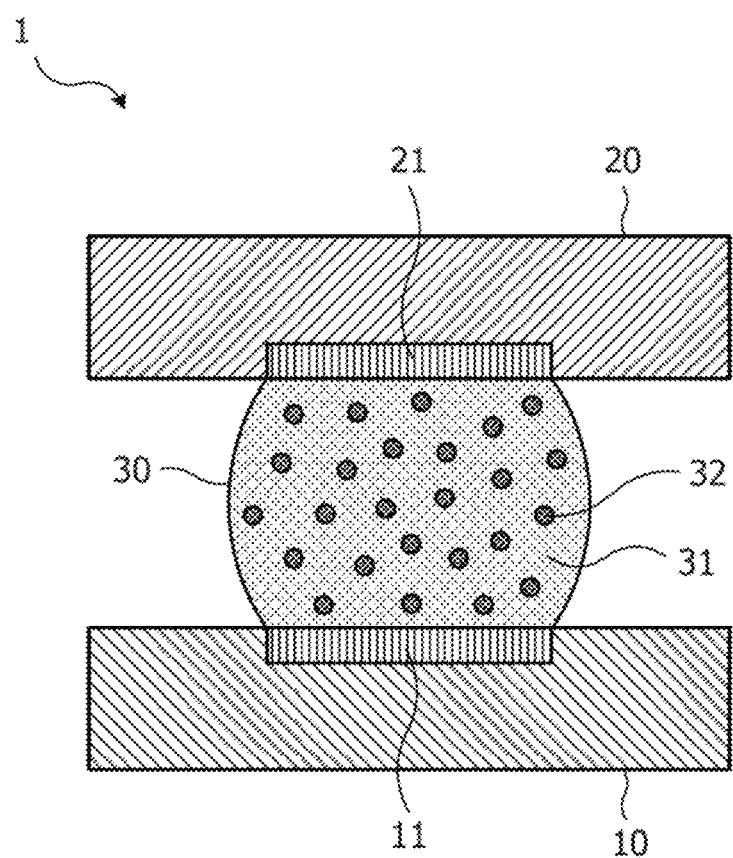
FIG. 1 is a diagram illustrating a first example of an electronic apparatus according to a first embodiment.
Figure 2A:
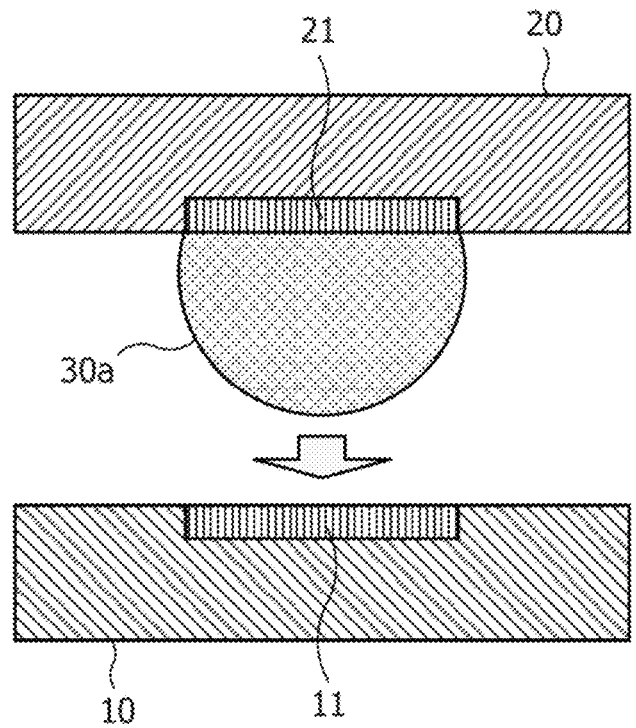
FIGS. 2A and 2B are diagrams illustrating a method for forming a first example of an electronic apparatus according to a first embodiment.
Figure 2B:
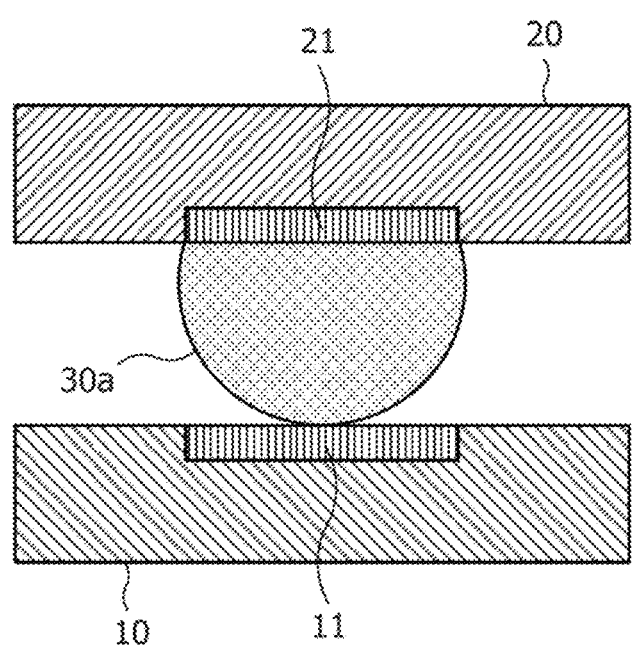

A first embodiment is described below. FIG. 1 illustrates a first example of an electronic apparatus according to the first embodiment. FIG. 1 schematically illustrates a cross section of the first example of the electronic apparatus according to the first embodiment. FIGS. 2A and 2B illustrate a method for manufacturing the first example of the electronic apparatus according to the first embodiment. FIGS. 2A and 2B are schematic cross-sectional views of the first example of the electronic apparatus which illustrate an example joining process.

The electronic apparatus 1 illustrated in FIG. 1 includes electronic components 10 and 20 and solder 30. The electronic component 10 includes an electrode 11. The electronic component 20, which is arranged to face the electronic component 10, includes an electrode 21 at a position corresponding to the position of the electrode 11 included in the electronic component 10. The electrodes 11 and 21 are composed of, for example, copper (Cu), a material containing Cu, nickel (Ni), a material containing Ni, gold (Au), or a material containing Au. The electrodes 11 and 21 may be a single electrode layer composed of Cu, Ni, Au, or the like or may include plural electrode layers composed of Cu, Ni, Au, or the like. The electrodes 11 and 21 may also have a multilayer structure including such an electrode layer and a barrier metal layer stacked on the electrode layer. The barrier metal layer is composed of Ni, tantalum (Ta), titanium (Ti), Tungsten (W), Aluminium (Al), or the like.

The solder 30 is joined to the electrode 11 of the electronic component 10 and the electrode 21 of the electronic component 20. The electronic components 10 and 20 are electrically connected to each other with the solder 30, which is joined to the electrodes 11 and 21 of the respective electronic components.

The electrodes 11 and 21 are joined to each other with the solder 30, for example, in the following manner. The electronic component 20 including the electrode 21 on which solder 30a is deposited is arranged to face the electronic component 10 such that the electrode 21 is aligned with the electrode 11 as illustrated in FIG. 2A. Subsequently, the solder 30a is brought into contact with the electrode 11 as illustrated in FIG. 2B. While the solder 30a is in contact with the electrode 11, heating is performed to the temperature at which the solder 30a melts and cooling is subsequently performed to solidify the solder 30a. In this manner, the electrodes 11 and 21 are joined to each other with the solder 30, and thereby the electronic component 10 and the electronic component 20 are electrically connected to each other with the solder 30 as illustrated in FIG. 1.

The solder 30a (FIGS. 2A and 2B) deposited on the electrode 21 that is not joined to the electrode 11, and the solder 30 (FIG. 1) interposed between the electrodes 11 and 21 joined to each other contain tin (Sn), In, Ag, and Cu as constituent elements. The solder 30a and the solder 30 contain, for example, 40% to 65% by weight of In, 0.01% to 5% by weight of Ag, 0.01% to 1% by weight of Cu, and the balance being Sn and the like.

A layer including the constituent elements of the solder 30 and the constituent elements of the electrode 11 may be formed at the interface between the solder 30 and the electrode 11 after the electrodes 11 and 21 are joined to each other. A layer including the constituent elements of the solder 30 and the constituent elements of the electrode 21 may be formed at the interface between the solder 30 and the electrode 21 after the electrodes 11 and 21 are joined to each other. For example, in the case where the solder 30 contains the above-described constituent elements, an InAu layer may be formed at the interface between the solder 30 and the electrode 11 and between the solder 30 and the electrode 21 when the surface layers of the electrodes 11 and 21 are composed of Au, and a CuInSn layer may be formed at the interface between the solder 30 and the electrode 11 and between the solder 30 and the electrode 21 when the surface layers of the electrodes 11 and 21 are composed of Cu.

As illustrated in FIG. 1, the solder 30 includes a phase containing In and Sn, that is, an InSn-containing phase 31, and a phase containing In, Ag, and Cu, that is, an InAgCu-containing phase 32. The InSn-containing phase 31 of the solder 30 is a phase mainly composed of In and Sn. The InAgCu-containing phase 32 of the solder 30 is a phase mainly composed of In, Ag, and Cu. The InSn-containing phase 31 may further contain, as constituent elements, Ag, Cu, constituents diffused from the electrodes 11 and 21, inevitable impurities, and the like in addition to the main constituent elements, that is, In and Sn. The InAgCu-containing phase 32 may further contain, as constituent elements, Sn, constituents diffused from the electrodes 11 and 21, inevitable impurities, and the like in addition to the main constituent elements, that is, In, Ag, and Cu.

The InAgCu-containing phase 32 is dispersed in the InSn-containing phase 31. The InAgCu-containing phase 32 has a structure in which Cu is dissolved in $AgIn_2$, which is an Ag—In intermetallic compound. The InAgCu-containing phase 32, which is dispersed in the InSn-containing phase 31, primarily has a relatively fine size of, for example, 2 μm or less.

In—Sn eutectic solder containing In and Sn has high ductility. When solder is used for joining, for example, the electronic components 10 and 20 as described above, the ductility of the solder contributes to a reduction in the stress applied to the joint due to the heat applied or generated. However, In—Sn eutectic solder has a low mechanical strength and may fail to form joints having high durability despite having high ductility.

A technique in which Ag is added to In—Sn eutectic solder in order to increase the mechanical strength of the solder is known. Adding Ag to In—Sn eutectic solder causes an Ag—In intermetallic compound to be produced in the solder, which increases the mechanical strength of the solder by a certain degree. However, the size of the Ag—In intermetallic compound may increase to, for example, 50 μm or more. If the size of the Ag—In intermetallic compound is increased, the ductility of the solder may degraded. In such a case, when a stress is applied to the joint, the stress is concentrated at the joint, which is likely to cause cracking and rupturing at the joint. As a result, the durability of the joint may be degraded.

In contrast, the above-described electronic apparatus 1 includes the solder 30 used for joining the electronic components 10 and 20 to each other, the solder 30 including the InAgCu-containing phase 32 dispersed therein. As described above, the InAgCu-containing phase 32 has a structure in which Cu is dissolved in an Ag—In intermetallic compound $AgIn_2$ and a relatively fine size. Adding Cu together with Ag to solder containing In limits an increase in the size of the Ag—In intermetallic compound and enables a fine InAgCu-containing phase 32 to be dispersed in the solder 30. The solder 30 including the InAgCu-containing phase 32 dispersed therein in the above-described manner has higher ductility and a higher mechanical strength than In—Sn eutectic solder, solder produced by adding Ag to In—Sn eutectic solder, and the like. Details of the ductility and the mechanical strength of the solder 30 including the InAgCu-containing phase 32 dispersed therein are described below.

Figure 3:
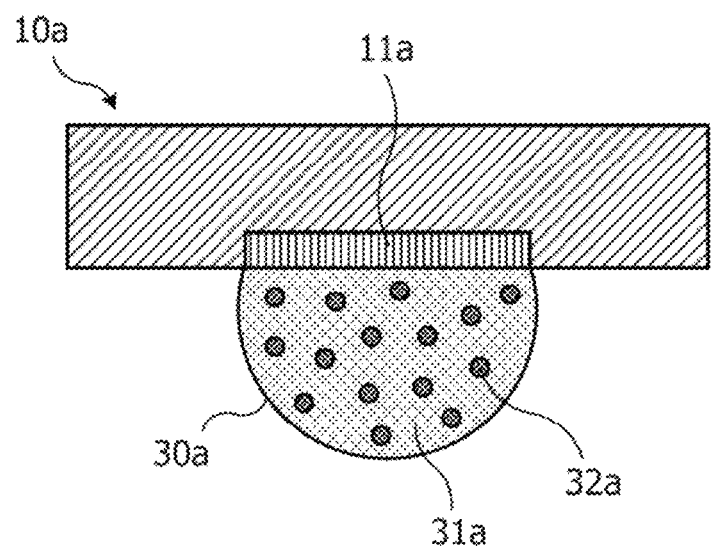
FIG. 3 is a diagram illustrating a second example of an electronic apparatus according to a first embodiment.
Figure 4A:
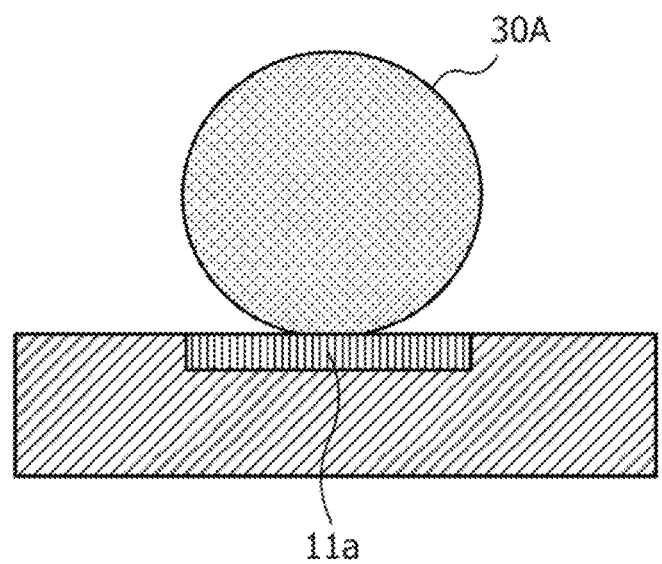
FIGS. 4A and 4B are diagrams illustrating a method for forming a second example of an electronic apparatus according to a first embodiment.
Figure 4B:
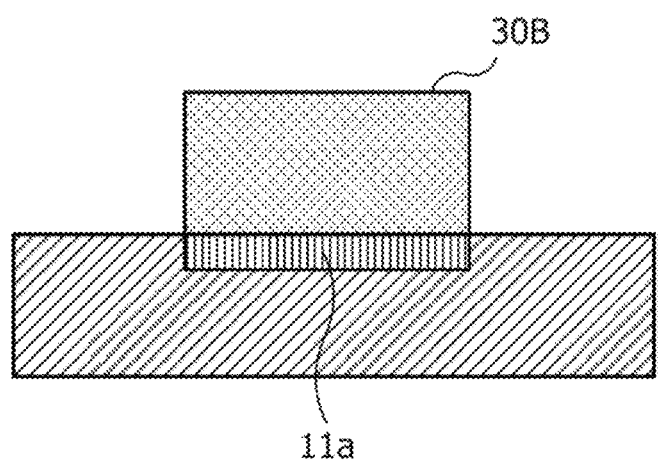

Using the solder 30 having high ductility and a high mechanical strength for joining the electronic components 10 and 20 to each other enables the electronic apparatus 1 having high joint durability to be produced. FIG. 3 illustrates a second example of the electronic apparatus according to the first embodiment. FIG. 3 is a schematic cross-sectional view of the second example of the electronic apparatus according to the first embodiment. FIGS. 4A and 4B illustrate a method for manufacturing the second example of the electronic apparatus according to the first embodiment. FIGS. 4A and 4B are schematic cross-sectional views of the second example of the electronic apparatus which illustrate an example solder-depositing process.

The electronic apparatus (i.e., electronic component) 10a illustrated in FIG. 3 includes an electrode 11a and solder 30a deposited on the electrode 11a. The electrode 11a is composed of, for example, Cu, a material containing Cu, Ni, a material containing Ni, Au, or a material containing Au. The electrode 11a may be a single electrode layer composed of Cu, Ni, Au, or the like or may include plural electrode layers composed of Cu, Ni, Au, or the like. The electrode 11a may have a multilayer structure including such an electrode layer and a barrier metal layer disposed on the electrode layer, the barrier metal layer being composed of Ni, Ta, Ti, W, Al, or the like.

The electronic apparatus 10a including the electrode 11a on which the solder 30a is deposited is formed in the following manner. A solder ball 30A or solder paste 30B containing solder is deposited on the electrode 11a as illustrated in FIGS. 4A and 4B. Subsequently, heating is performed to the temperature at which the solder ball 30A or the solder contained in the solder paste 30B melts and then cooling is performed to solidify the solder ball 30A or the solder contained in the solder paste 30B. Thus, the solder 30a illustrated in FIG. 3 is formed.

The solder ball 30A or the solder contained in the solder paste 30B deposited on the electrode 11a that is not joined to the solder ball 30A or the solder paste 30B (FIGS. 4A and 4B) and the solder 30a deposited on the electrode 11a joined to the solder ball 30A or the solder paste 30B (FIG. 3) contain Sn, In, Ag, and Cu as constituent elements. The solder ball 30A or the solder contained in the solder paste 30B and the solder 30a contain, for example, 40% to 65% by weight of In, 0.01% to 5% by weight of Ag, 0.01% to 1% by weight of Cu, and the balance being Sn and the like.

A layer including the constituent elements of the solder 30a and the constituent elements of the electrode 11a may be formed at the interface between the solder 30a and the electrode 11a. For example, in the case where the solder 30a contains the above-described constituent elements, an InAu layer may be formed at the interface between the solder 30a and the electrode 11a when the surface layer of the electrode 11a is composed of Au, and a CuInSn layer may be formed at the interface between the solder 30a and the electrode 11a when the surface layer of the electrode 11a is composed of Cu.

As illustrated in FIG. 3, the solder 30a includes a phase containing In and Sn, that is, an InSn-containing phase 31a, and a phase containing In, Ag, and Cu, that is, an InAgCu-containing phase 32a. The InSn-containing phase 31a of the solder 30a is a phase mainly composed of In and Sn. The InAgCu-containing phase 32a of the solder 30a is a phase mainly composed of In, Ag, and Cu. The InSn-containing phase 31a may further contain, as constituent elements, Ag, Cu, constituents diffused from the electrode 11a, inevitable impurities, and the like in addition to the main constituent elements, that is, In and Sn. The InAgCu-containing phase 32a may further contain, as constituent elements, Sn, constituents diffused from the electrode 11a, inevitable impurities, and the like in addition to the main constituent elements, that is, In, Ag, and Cu.

The InAgCu-containing phase 32a is dispersed in the InSn-containing phase 31a. For example, the InAgCu-containing phase 32a has a structure in which Cu is dissolved in $AgIn_2$, which is an Ag—In intermetallic compound. The InAgCu-containing phase 32a, which is dispersed in the InSn-containing phase 31a, primarily has a relatively fine size of, for example, 2 μm or less.

The electronic apparatus 10a includes the electrode 11a and the solder 30a deposited on the electrode 11a, the solder 30a including the InAgCu-containing phase 32a dispersed therein. As described above, the InAgCu-containing phase 32a has a structure in which Cu is dissolved in an Ag—In intermetallic compound $AgIn_2$ and a relatively fine size. Adding Cu together with Ag to solder containing In limits an increase in the size of the Ag—In intermetallic compound and enables a fine InAgCu-containing phase 32a to be dispersed in the solder 30a. The solder 30a including the InAgCu-containing phase 32a dispersed therein in the above-described manner has higher ductility and a higher mechanical strength than In—Sn eutectic solder, solder produced by adding Ag to In—Sn eutectic solder, and the like. Details of the ductility and the mechanical strength of the solder 30a including the InAgCu-containing phase 32a dispersed therein are described below.

Depositing the solder 30a having high ductility and a high mechanical strength on the electrode 11a of the electronic apparatus 10a enables the durability of the joint between the solder 30a and the electrode 11a to be enhanced.

When the electronic apparatus 10a is joined to another electronic component or electronic apparatus with the solder 30a, the electronic apparatus 10a may be joined to the other electronic component or electronic apparatus with the solder 30 illustrated in FIG. 1, which enhances the durability of the joint between the electronic apparatus 10a and the other electronic component or electronic apparatus. In such a case, the solder 30a deposited on the electrode 11a of the electronic apparatus 10a is melted due to heating performed in the joining process and subsequently solidified due to cooling. At this time, the InAgCu-containing phase 32a included in the solder 30a temporarily disappears while the solder 30a is melted (liquid-phase condition) and reproduced when the solder 30a is solidified. As a result, the solder 30 illustrated FIG. 1 is formed.

The above-described electronic components 10 and 20 may be semiconductor elements (e.g., semiconductor chips), semiconductor apparatuses (e.g., semiconductor packages) including a semiconductor chip disposed on a circuit board, circuit boards, or the like. The electronic components 10 and 20 may also be semiconductor apparatuses (e.g., semiconductor packages) including a semiconductor chip buried in a resin and a redistribution layer disposed on the semiconductor chip. The above-described electronic apparatus (i.e., electronic component) 10a and the other electronic component or electronic apparatus joined to the electronic apparatus 10a may also be a semiconductor chip, a semiconductor package, a circuit board, or the like similarly to the electronic components 10 and 20.

Examples of the combination of the electronic components 10 and 20 that are to be joined to each other and the combination of the electronic apparatus 10a and the other electronic component or electronic apparatus that are to be joined to each other include a combination of a semiconductor chip and a circuit board, a combination of a semiconductor package and a circuit board, a combination of a semiconductor chip and a semiconductor package, a combination of semiconductor chips, a combination of semiconductor packages, and a combination of circuit boards.

Figure 5:
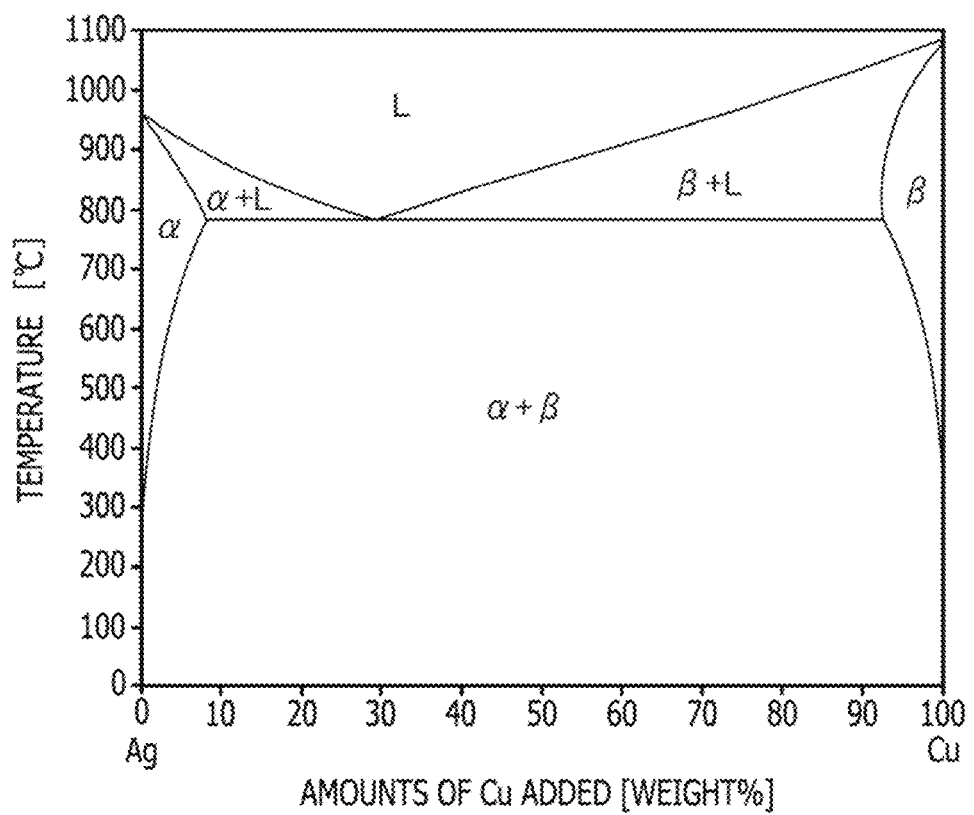
FIG. 5 is an Ag—Cu phase diagram.

The above-described InAgCu-containing phase is further described below. FIG. 5 illustrates the Ag—Cu phase diagram. In FIG. 5, the horizontal axis represents the amount of Cu [weight %] added to Ag and the vertical axis represents temperature [° C]. In FIG. 5, α and β represent a solid phase and L represents a liquid phase.

As illustrated in FIG. 5, the Ag—Cu phase diagram is of the eutectic type. As illustrated in FIG. 5, in the Ag—Cu binary system, Ag and Cu exist in the solid state (α+β) and do not dissolve in each other at a temperature of 200° C. or less, at which "low-melting-point solder" melts. Ag and Cu are considered to slightly dissolve in each other at a higher temperature, that is, 300° C. or more.

Figure 6:
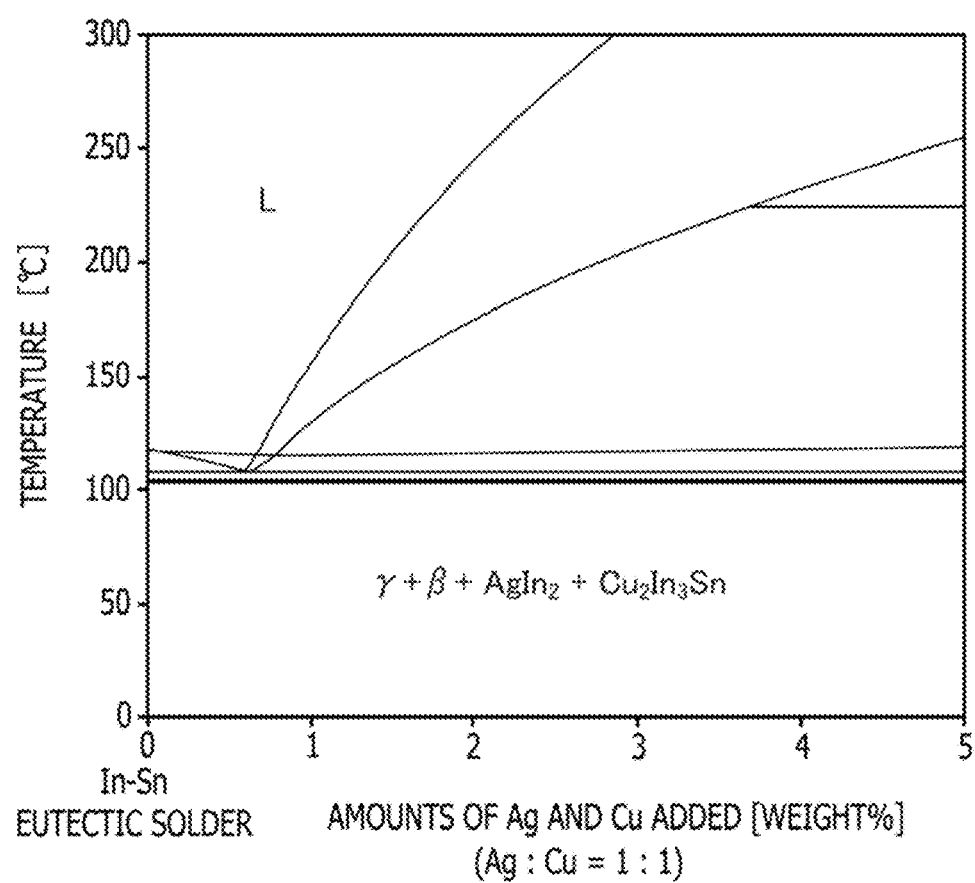
FIG. 6 is an In—Sn—Ag—Cu computational phase diagram (Part 1)
Figure 7:
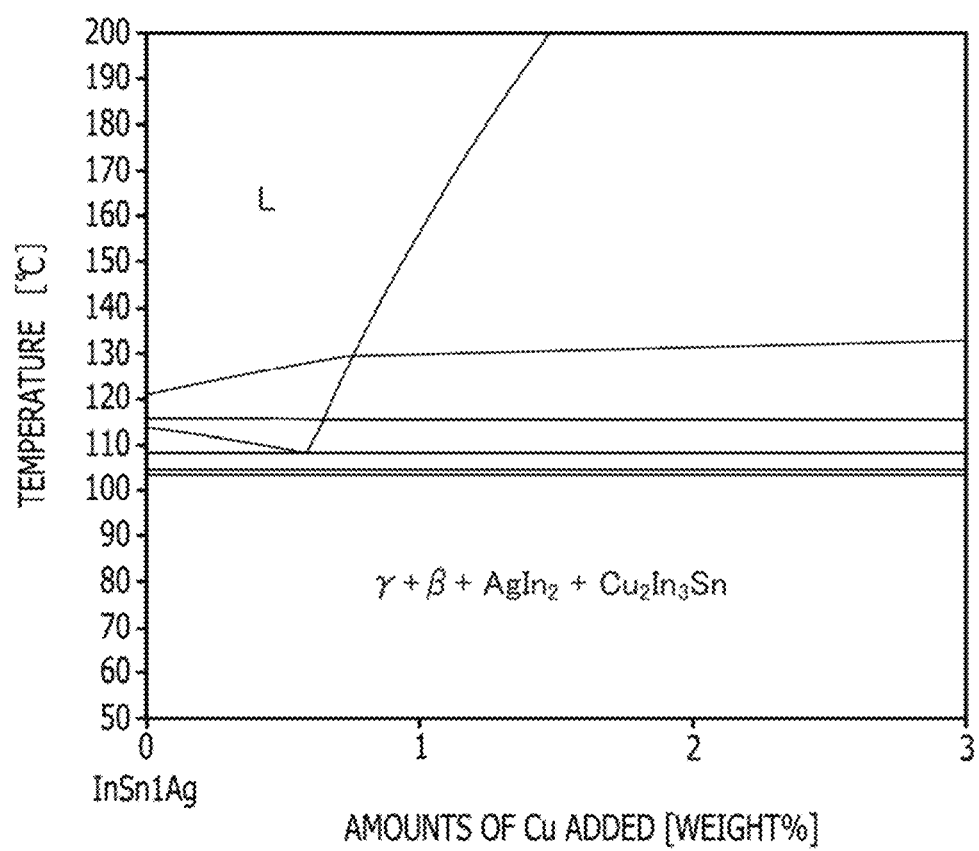
FIG. 7 is an In—Sn—Ag—Cu computational phase diagram (Part 2)

FIGS. 6 and 7 are In—Sn—Ag—Cu computational phase diagrams. FIG. 6 is a computational phase diagram of a case where Ag and Cu are added to In—Sn eutectic solder containing 52% by weight of In and 48% by weight of Sn such that the ratio between the amounts of Ag and Cu added is 1:1. In FIG. 6, the horizontal axis represents the amounts of Ag and Cu added [weight %] with the origin being In—Sn eutectic solder and the vertical axis represents a temperature [° C]. For example, when the amounts of Ag and Cu added on the horizontal axis is 1% by weight, 1% by weight of Ag and 1% by weight of Cu are added to In—Sn eutectic solder.

FIG. 7 is a computational phase diagram of a case where Cu is added to solder (InSn1Ag) produced by adding 1% by weight of Ag to In—Sn eutectic solder. In FIG. 7, the horizontal axis represents the amount of Cu added [weight %] with the origin being InSn1Ag and the vertical axis represents a temperature [° C]. The origin of the computational phase diagram illustrated in FIG. 7 represents a composition In:Sn:Ag:Cu=51.5 weight %:47.5 weight %:1 weight %:0 weight %. For example, when the amount of Cu added on the horizontal axis is 1% by weight, the composition In:Sn:Ag:Cu is 51 weight %:47 weight %:1 weight %:1 weight %. The compositional proportions of In and Sn are reduced in proportion to the amount of Cu added.

In FIGS. 6 and 7, β and γ represent a solid phase (i.e., InSn phase) and L represents a liquid phase. The β phase represents an InSn phase in which In:Sn=3:1 and they phase represents an InSn phase in which In:Sn=1:4.

As illustrated in FIG. 6, when Ag and Cu are added to the In—Sn eutectic solder such that the ratio between the amounts of Ag and Cu added is 1:1, the β phase, the γ phase, the AgIn$_2$ phase, and the Cu$_2$In$_3$Sn phase are formed at 100° C. or less. Ag and Cu added to the In—Sn eutectic solder form different intermetallic compounds, that is, AgIn$_2$ and Cu$_2$In$_3$Sn, respectively, at 100° C. or less.

As illustrated in FIG. 7, when 1% by weight of Ag and a predetermined amount of Cu are added to In—Sn eutectic solder, the β phase, the γ phase, the AgIn$_2$ phase, and the Cu$_2$In$_3$Sn phase are also formed at 100° C. or less. Ag and Cu added to the In—Sn eutectic solder form different intermetallic compounds, that is, AgIn$_2$ and Cu$_2$In$_3$Sn, respectively, at 100° C. or less.

As described above, when Ag and Cu, which do not dissolve in each other at 200° C. or less in the Ag—Cu binary system, are added to In—Sn eutectic solder, Ag and Cu form different intermetallic compounds (β+γ+AgIn$_2$+Cu$_2$In$_3$Sn) at 100° C. or less. The solder (30, 30a) including the InAgCu-containing phase (32, 32a) containing Cu dissolved in AgIn$_2$ and the InSn-containing phase (31, 31a) in which the InAgCu-containing phase (32, 32a) is dispersed may be produced in the temperature region between the temperature at which the solid phase containing such an intermetallic compound occurs and the temperature at which the liquid phase occurs.

Figure 8:
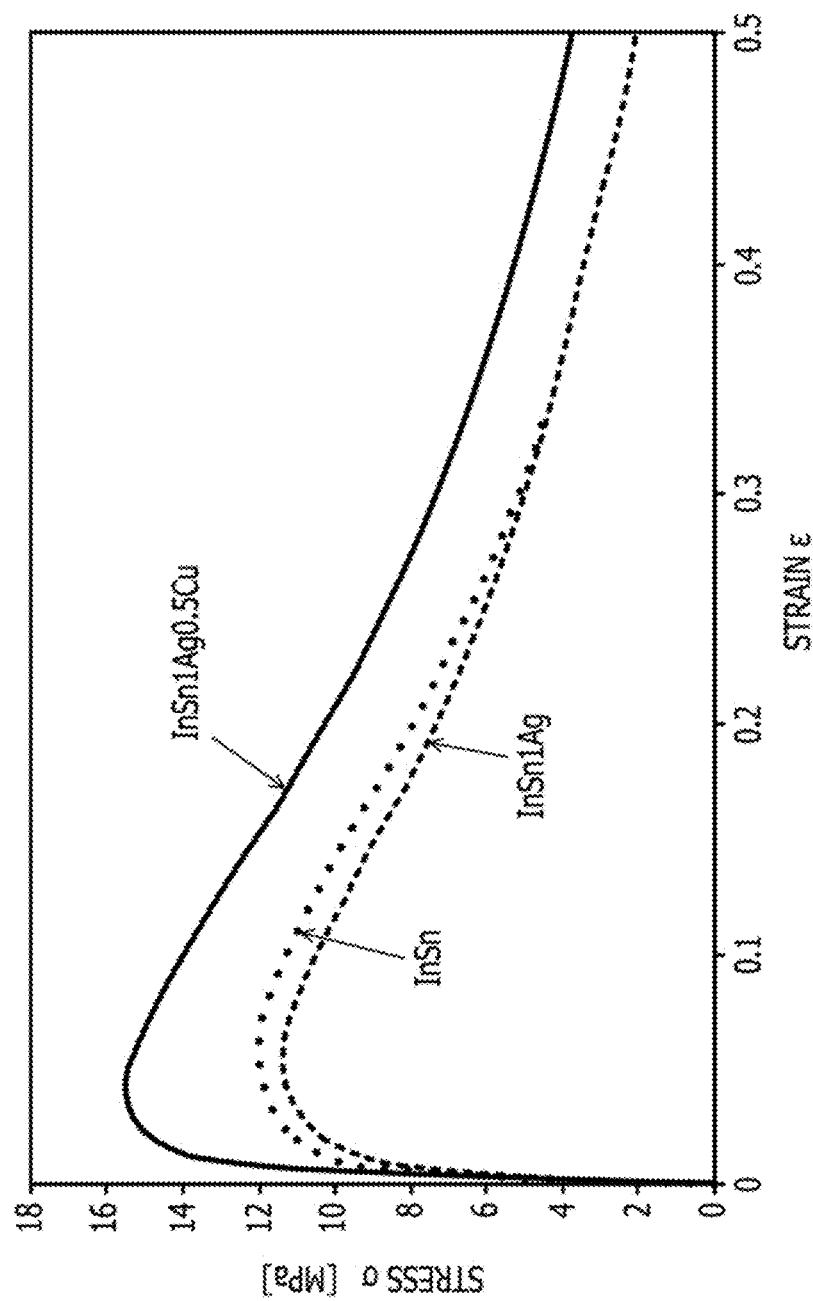
FIG. 8 is a diagram illustrating the results of a tensile test (Part 1)

FIG. 8 illustrates the results of tensile tests of In—Sn eutectic solder, solder (InSn1Ag) produced by adding 1% by weight of Ag to In—Sn eutectic solder, and solder (InSn1Ag0.5Cu) produced by adding 1% by weight of Ag and 0.5% by weight of Cu to In—Sn eutectic solder. FIG. 8 illustrates the relationships between the stress σ[MPa] and the strain ε of dumbbell test pieces prepared from the In—Sn eutectic solder, the InSn1Ag solder, and the InSn1Ag0.5Cu solder having a thickness of 4 mm, a width of 5 mm, and a gage length of 20 mm which are measured while the test pieces are subjected to a tensile testing machine at a tensile speed of 2 mm/min.

The InSn (i.e., eutectic solder) sample is prepared by melting and then solidifying solder containing 52% by weight of In and 48% by weight of Sn. The InSn1Ag sample is prepared by melting and then solidifying solder containing 51.5% by weight of In, 47.5% by weight of Sn, and 1% by weight of Ag. The InSn1Ag0.5Cu sample is prepared by melting and then solidifying solder containing 51% by weight of In, 47% by weight of Sn, 1% by weight of Ag, and 0.5% by weight of Cu.

Figure 9A:
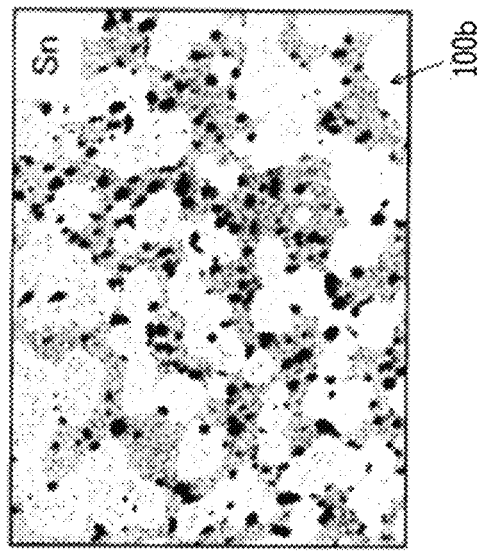
FIGS. 9A to 9C are diagrams illustrating the results of the elementary analysis of solder produced by adding 1% by weight of Ag to In—Sn eutectic solder.
Figure 9B:
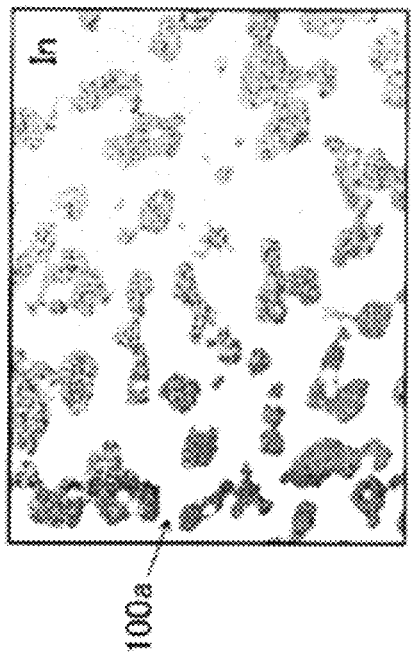
Figure 9C:
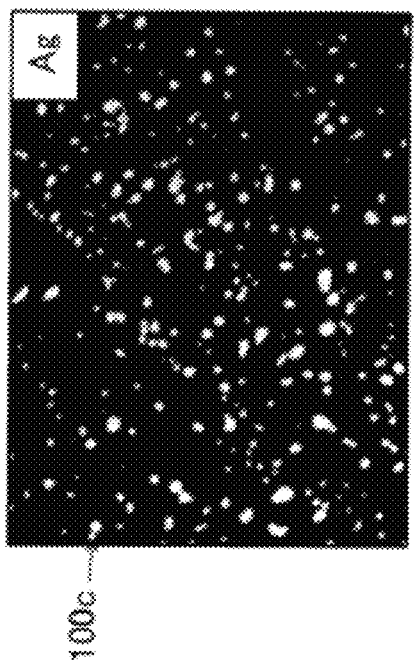

FIGS. 9A to 9C illustrate the results of the elementary analysis of InSn1Ag. FIGS. 10A to 10D illustrate the elementary analysis of InSn1Ag0.5Cu. In FIGS. 9A to 10D, a portion that does not contain a desired element appears in black and a portion that contains the desired element appears in white with a density depending on the content of the element. FIG. 9A illustrates the results of the analysis of In contained in InSn1Ag. FIG. 9B illustrates the results of the analysis of Sn contained in InSn1Ag. FIG. 9C illustrates the results of the analysis of Ag contained in InSn1Ag.

Figure 10B:
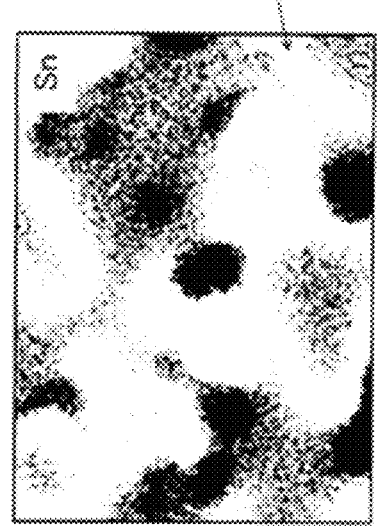
FIGS. 10A to 10D are diagrams illustrating the results of the elementary analysis of solder produced by adding 1% by weight of Ag and 0.5% by weight of Cu to In—Sn eutectic solder.
Figure 10D:
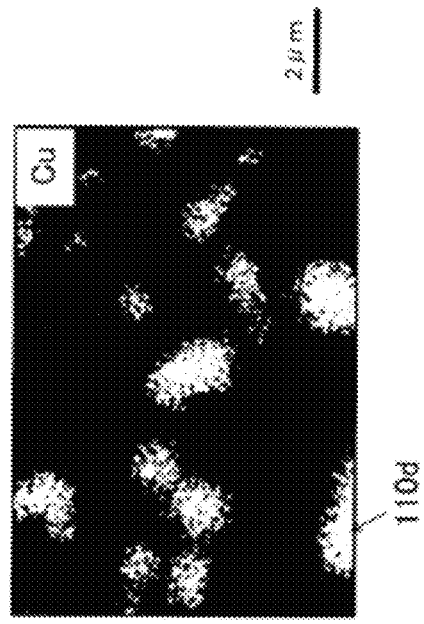
Figure 10A:
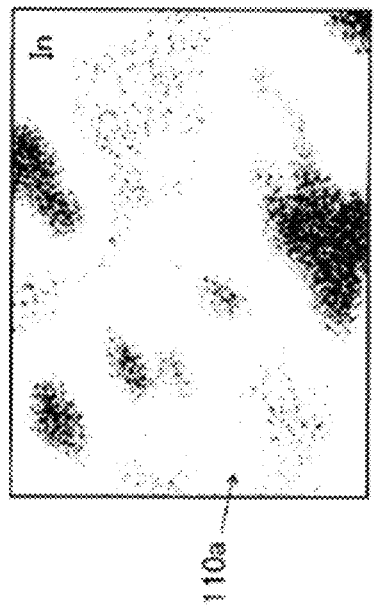
Figure 10C:
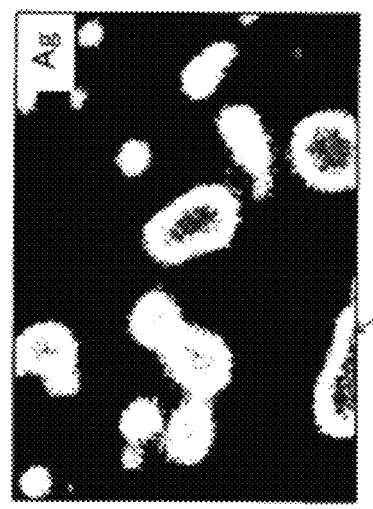

FIG. 10A illustrates the results of the analysis of In contained in InSn1Ag0.5Cu. FIG. 10B illustrates the results of the analysis of Sn contained in InSn1Ag0.5Cu. FIG. 10C illustrates the results of the analysis of Ag contained in InSn1Ag0.5Cu. FIG. 10D illustrates the results of the analysis of Cu contained in InSn1Ag0.5Cu.

In contained in InSn1Ag is present in a region 100a illustrated in FIG. 9A, whereas Sn contained in InSn1Ag is present in a region 100b illustrated in FIG. 9B. A region 100c in which Ag is present is dispersed in InSn1Ag as illustrated in FIG. 9C. As illustrated in FIGS. 9A and 9C, In is present (FIG. 9A) in the region 100c (FIG. 9C) of InSn1Ag in which Ag is present. On the other hand, as illustrated in FIGS. 9B and 9C, Sn is absent (FIG. 9B) in the region 100c (FIG. 9C) of InSn1Ag in which Ag is present.

FIGS. 9A to 9C confirm that InSn1Ag has a structure in which a phase containing In and Ag, that is, an In—Ag-containing phase, is dispersed in an InSn-containing phase, which contains In and Sn. The In—Ag-containing phase is a relatively fine phase composed of AgIn$_2$, which is an In—Ag intermetallic compound.

In contained in InSn1Ag0.5Cu is present in a region 110a as illustrated in FIG. 10A, whereas Sn contained in InSn1Ag0.5Cu is present in a region 110b as illustrated in FIG. 10B. A region 110c in which Ag is present is dispersed in InSn1Ag0.5Cu as illustrated in FIG. 10C. As illustrated in FIGS. 10A to 10C, In is present (FIG. 10A) but Sn is absent (FIG. 10B) in the region 110c (FIG. 10C) of InSn1Ag0.5Cu in which Ag is present. As illustrated in FIGS. 10C and 10D, a region 110d (FIG. 10D) of InSn1Ag0.5Cu in which Cu is present is located at positions corresponding to the positions of the region 110c (FIG. 10C) in which Ag is present.

FIGS. 10A to 10D confirm that InSn1Ag0.5Cu has a structure in which a phase containing In, Ag, and Cu, that is, an InAgCu-containing phase, is dispersed in an InSn-containing phase, which contains In and Sn. The InAgCu-containing phase is a relatively fine phase composed of an intermetallic compound containing AgIn$_2$ and Cu dissolved in AgIn$_2$.

There is no great difference between InSn1Ag (FIGS. 9A to 9C) and InSn1Ag0.5Cu (FIGS. 10A to 10D) in terms of the sizes of the In—Ag-containing phase and the InAgCu-containing phase and the like, except that InSn1Ag0.5Cu includes Cu in its structure.

The results of the tensile tests illustrated in FIG. 8 confirm that InSn1Ag (dashed line in FIG. 8), which is produced by adding 1% by weight of Ag to the In—Sn eutectic solder, desires a smaller amount of stress to create a certain amount of strain than InSn (dotted line in FIG. 8) having the eutectic composition. In contrast, InSn1Ag0.5Cu (solid line in FIG. 8), which is produced by adding 1% by weight of Ag and 0.5% by weight of Cu to In—Sn eutectic solder, desires a larger amount of stress to create a certain amount of strain than InSn (dotted line in FIG. 8) having the eutectic composition.

As described above, InSn1Ag has a structure including the InSn-containing phase and the relatively fine In—Ag-containing phase dispersed in the InSn-containing phase (FIGS. 9A to 9C), and InSn1Ag0.5Cu has a structure including the InSn-containing phase and the relatively fine InAgCu-containing phase dispersed in the InSn-containing phase (FIGS. 10A to 10D). FIG. 8 confirms that InSn1Ag0.5Cu, in which the relatively fine InAgCu-containing phase is dispersed in the InSn-containing phase, enables mechanical strength to be increased compared with InSn having the eutectic composition, that is, containing neither Ag nor Cu, and InSn1Ag containing Ag but not containing Cu. Furthermore, InSn1Ag0.5Cu, in which the relatively fine InAgCu-containing phase is dispersed in the InSn-containing phase, limits the degradation of ductility despite containing Ag and Cu.

In this embodiment, InSn1Ag0.5Cu produced by adding 1% by weight of Ag and 0.5% by weight of Cu to In—Sn eutectic solder is described as an example solder. However, the composition of solder is not limited to this. Any solder containing 40% to 65% by weight of In, 0.01% to 5% by weight of Ag, 0.01% to 1% by weight of Cu, and the balance including Sn may have a structure including the relatively fine InAgCu-containing phase dispersed therein as described above, which achieves high ductility and a high mechanical strength.

If the amount of Ag added together with Cu (0.01% to 1% by weight) relative to the predetermined amount of In (40% to 65% by weight) and Sn is smaller than 0.01% by weight, a relatively coarse intermetallic compound mainly composed of Cu is likely to be created when the solder is melted and then solidified. If the amount of Ag added together with Cu (0.01% to 1% by weight) relative to the predetermined amount of In (40% to 65% by weight) and Sn is larger than 5% by weight, a relatively coarse intermetallic compound mainly composed of Ag is likely to be created when the solder is melted and then solidified. The presence of the relatively coarse intermetallic compound mainly composed of Cu or the relatively coarse intermetallic compound mainly composed of Ag in the InSn-containing phase increase the occurrence of embrittlement of the solder.

Figure 11:
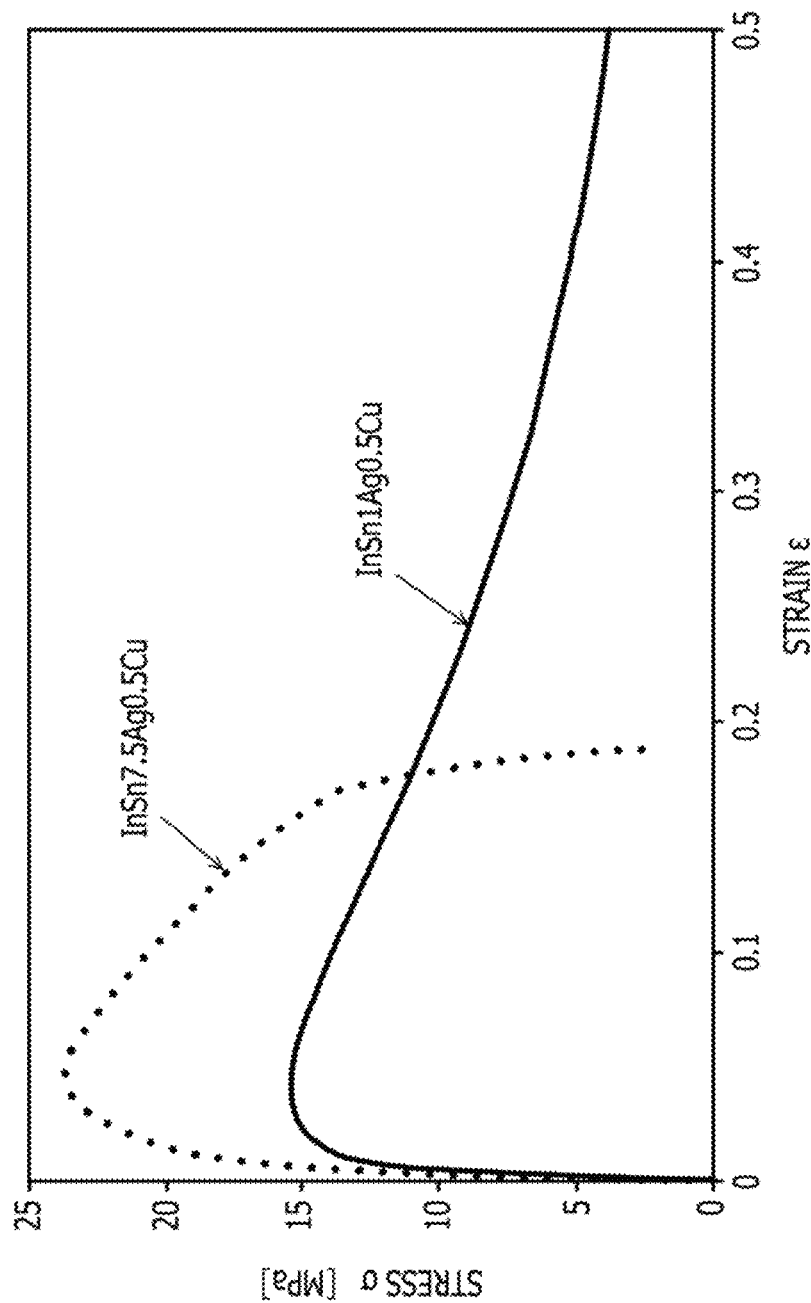
FIG. 11 is a diagram illustrating the results of a tensile test (Part 2)

For example, FIG. 11 illustrates the results of tensile tests of solder (InSn1Ag0.5Cu) produced by adding 1% by weight of Ag and 0.5% by weight of Cu to In-Sn eutectic solder and solder (InSn7.5Ag0.5Cu) produced by adding 7.5% by weight of Ag and 0.5% by weight of Cu to In—Sn eutectic solder. FIG. 11 illustrates the relationships between stress σ[MPa] and strain ε which are obtained using the same tensile testing machine under the same conditions as in FIG. 8.

The sample of InSn7.5Ag0.5Cu is prepared by melting and then solidifying solder containing 48% by weight of In, 44% by weight of Sn, 7.5% by weight of Ag, and 0.5% by weight of Cu.

Figure 12A:
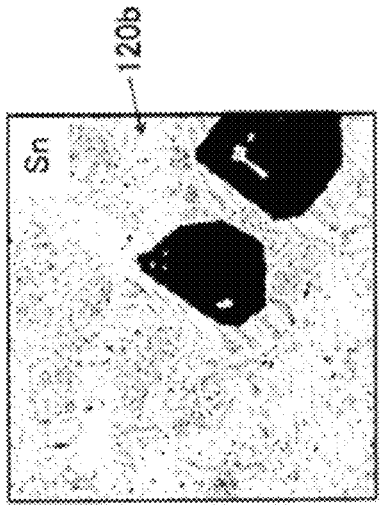
FIGS. 12A to 12D are diagrams illustrating the results of the elementary analysis of solder produced by adding 7.5% by weight of Ag and 0.5% by weight of Cu to In—Sn eutectic solder.
Figure 12B:
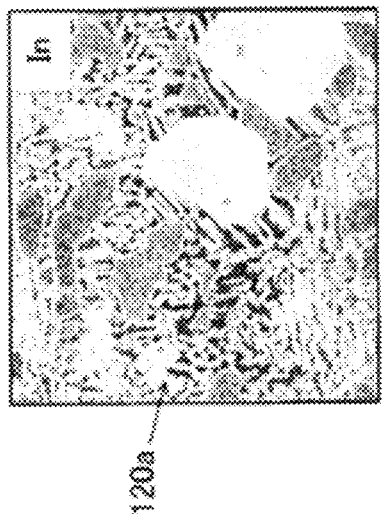
Figure 12C:
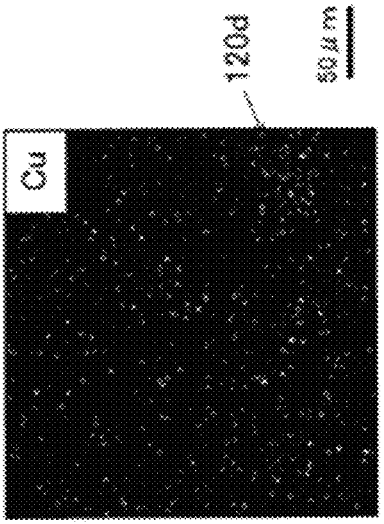
Figure 12D:
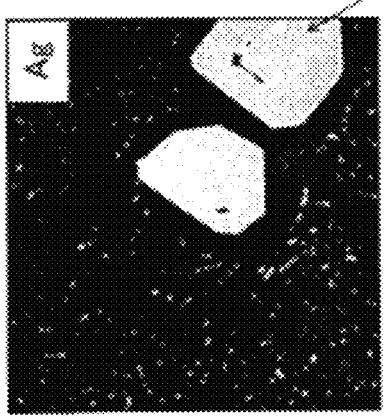

FIGS. 12A to 12D illustrate the results of the elementary analysis of InSn7.5Ag0.5Cu. In FIGS. 12A to 12D, a portion that does not contain a desired element appears in black and a portion that contains the desired element appears in white with a density depending on the content of the element. FIG. 12A illustrates the results of the analysis of In contained in InSn7.5Ag0.5Cu. FIG. 12B illustrates the results of the analysis of Sn contained in InSn7.5Ag0.5Cu. FIG. 12C illustrates the results of the analysis of Ag contained in InSn7.5Ag0.5Cu. FIG. 12D illustrates the results of the analysis of Cu contained in InSn7.5Ag0.5Cu.

In contained in InSn7.5Ag0.5Cu is present in a region 120a illustrated in FIG. 12A, whereas Sn contained in InSn7.5Ag0.5Cu is present in a region 120b illustrated in FIG. 12B. Ag contained in InSn7.5Ag0.5Cu is present in a region 120c as illustrated in FIG. 12C. The region 120c has a relatively large size of 50 μm or more. As illustrated in FIG. 12D, a region 120d in which Cu is present is dispersed in InSn7.5Ag0.5Cu. FIGS. 12A to 12C confirm that In is present (FIG. 12A) but Sn is absent (FIG. 12B) in the region 120c (FIG. 12C) of InSn7.5Ag0.5Cu in which Ag is present.

FIGS. 12A to 12D confirm that InSn7.5Ag0.5Cu has a structure including the InSn-containing phase containing In and Sn and a relatively coarse In—Ag-containing phase that is mainly composed of In and Ag and contains no Cu or a trace amount of Cu.

The results of the tensile tests illustrated in FIG. 11 confirm that the amount of stress that occurs in InSn7.5Ag0.5Cu (dotted line in FIG. 11) is larger than that in InSn1Ag0.5Cu (solid line in FIG. 11) when the amount of strain is relatively small. However, the amount of the stress that occurs in InSn7.5Ag0.5Cu (dotted line in FIG. 11) significantly decreases with an increase of the amount of strain compared with InSn1Ag0.5Cu (solid line in FIG. 11).

As described above, InSn7.5Ag0.5Cu, which contains a relatively large amount of Ag, includes the relatively coarse In—Ag-containing phase (FIGS. 12A to 12D). As illustrated in FIG. 11, the mechanical strength of InSn7.5Ag0.5Cu is increased when the amount of strain is relatively small. However, since InSn7.5Ag0.5Cu includes the relatively coarse In—Ag-containing phase, cracking is likely to occur at the relatively coarse In—Ag-containing phase with an increase in the amount of strain, which significantly deteriorates ductility as illustrated in FIG. 11.

In this embodiment, a case where the amount of Ag added is 7.5% by weight is taken as an example. The same tendency occurs when the amount of Ag added is more than 5% by weight. That is, when the amount of Ag added is more than 5% by weight, a relatively coarse intermetallic compound may be formed, which deteriorates ductility, although mechanical strength is increased in a specific strain range. On the other hand, if the amount of Ag added is less than 0.01% by weight, a coarse intermetallic compound mainly composed of Cu is likely to be formed, which also deteriorates ductility. Thus, the amount of Ag added together with Cu (0.01% to 1% by weight) relative to the predetermined amount of In (40% to 65% by weight) and Sn is desirably 0.01% to 5% by weight.

If the amount of Cu added together with Ag (0.01% to 5% by weight) relative to the predetermined amount of In (40% to 65% by weight) and Sn is smaller than 0.01% by weight, the mechanical strength of the solder may fail to be increased by a sufficient degree. If the amount of Cu added together with Ag (0.01% to 5% by weight) relative to the predetermined amount of In (40% to 65% by weight) and Sn is larger than 1% by weight, a relatively coarse intermetallic compound mainly composed of Cu is likely to be formed when the solder is melted and then solidified. The presence of the relatively coarse intermetallic compound mainly composed of Cu in the InSn-containing phase increases the occurrence of embrittlement of the solder.

Figure 13:
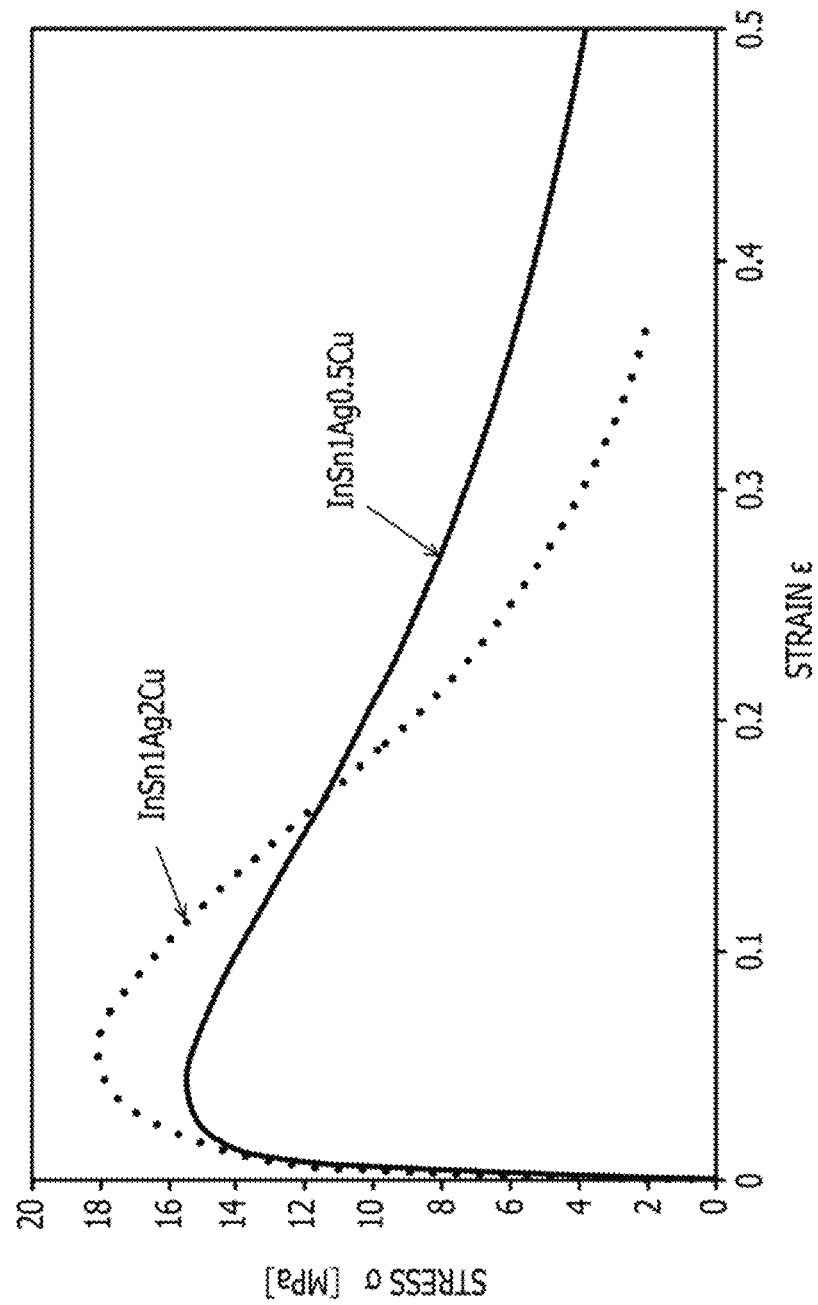
FIG. 13 is a diagram illustrating the results of a tensile test (Part 3)

For example, FIG. 13 illustrates the results of tensile tests of solder (InSn1Ag0.5Cu) produced by adding 1% by weight of Ag and 0.5% by weight of Cu to In—Sn eutectic solder and solder (InSn1Ag2Cu) produced by adding 1% by weight of Ag and 2% by weight of Cu to In—Sn eutectic solder. FIG. 13 illustrates the relationships between stress σ [MPa] and strain ε which are obtained using the same tensile testing machine under the same conditions as in FIGS. 8 and 11.

The sample of InSn1Ag2Cu is prepared by melting and then solidifying solder containing 50.5% by weight of In, 46.5% by weight of Sn, 1% by weight of Ag, and 2% by weight of Cu.

Figure 14B:
FIGS. 14A to 14D are diagrams illustrating the results of the elementary analysis of solder produced by adding 1% by weight of Ag and 2% by weight of Cu to In—Sn eutectic solder.
Figure 14D:
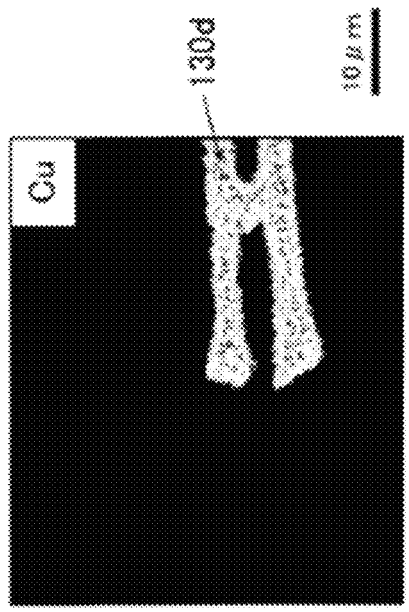
Figure 14A:
Figure 14C:
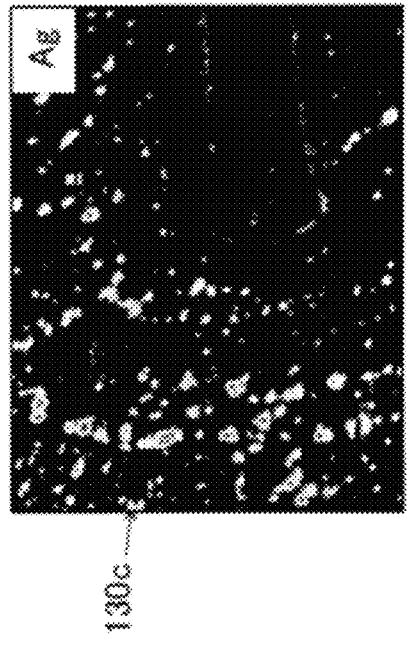

FIGS. 14A to 14D illustrate the results of the elementary analysis of InSn1Ag2Cu. In FIGS. 14A to 14D, a portion that does not contain a desired element appears in black and a portion that contains the desired element appears in white with a density depending on the content of the element. FIG. 14A illustrates the results of the analysis of In contained in InSn1Ag2Cu. FIG. 14B illustrates the results of the analysis of Sn contained in InSn1Ag2Cu. FIG. 14C illustrates the results of the analysis of Ag contained in InSn1Ag2Cu. FIG. 14D illustrates the results of the analysis of Cu contained in InSn1Ag2Cu.

In contained in InSn1Ag2Cu is present in a region 130*a* illustrated in FIG. 14A, whereas Sn contained in InSn1Ag2Cu is present in a region 130*b* illustrated in FIG. 14B. As illustrated in FIG. 14C, Ag is present in a region 130*c* having a relatively fine size, which is dispersed in InSn1Ag2Cu. As illustrated in FIG. 14D, InSn1Ag2Cu includes a region 130*d* in which Cu is present. The size of the region 130*d* is relatively large. In and Sn are present (FIGS. 14A and 14B) but no Ag or a trace amount of Ag is present (FIG. 14C) in the region 130*d* (FIG. 14D) of InSn1Ag2Cu in which Cu is present.

FIGS. 14A to 14D confirm that InSn1Ag2Cu has a structure including the InSn-containing phase containing In and Sn and a relatively coarse intermetallic compound phase that is mainly composed of Cu and contains In and no Ag or a trace amount of Ag.

The results of the tensile tests illustrated in FIG. 13 confirm that the amount of stress that occurs in InSn1Ag2Cu (dotted line in FIG. 13) is larger than that in InSn1Ag0.5Cu (solid line in FIG. 13) when the amount of strain is relatively small. However, the amount of the stress that occurs in InSn1Ag2Cu (dotted line in FIG. 13) significantly decreases with an increase in the amount of strain compared with InSn1Ag0.5Cu (solid line in FIG. 13).

As described above, InSn1Ag2Cu, which contains a relatively large amount of Cu, includes a relatively coarse intermetallic compound phase mainly composed of Cu (FIGS. 14A to 14D). As illustrated in FIG. 13, the mechanical strength of InSn1Ag2Cu is high when the amount of strain is relatively small. However, since InSn1Ag2Cu includes the relatively coarse intermetallic compound phase mainly composed of Cu, the occurrence of cracking at the relatively coarse intermetallic compound phase is increased with an increase in the amount of strain, which significantly deteriorates ductility as illustrated in FIG. 13.

In this embodiment, a case where the amount of Cu added is 2% by weight is taken as an example. The same tendency occurs when the amount of Cu added is more than 1% by weight. That is, when the amount of Cu added is more than 1% by weight, the relatively coarse intermetallic compound may be formed, which deteriorates ductility, although mechanical strength is increased in a specific strain range. On the other hand, if the amount of Cu added is less than 0.01% by weight, mechanical strength may fail to be increased by a sufficient degree. Thus, the amount of Cu added together with Ag (0.01% to 5% by weight) relative to the predetermined amount of In (40% to 65% by weight) and Sn is desirably 0.01% to 1% by weight.

If only Cu is added but Ag is not added to the solder containing the predetermined amount of In and Sn, the structure in which the fine intermetallic compound is dispersed may fail to be formed, which makes it difficult to produce solder having high ductility and a high mechanical strength.

Based on the above-described findings, it is considered that solder having a composition containing 40% to 65% by weight of In, 0.01% to 5% by weight of Ag, 0.01% to 1% by weight of Cu, and the balance including Sn has high ductility and a high mechanical strength. The solder having the above composition has a relatively low melting point of, for example, 108° C. to 117° C.

If the In content in the solder is lower than 40% by weight or higher than 65% by weight, the solidus temperature is increased, which makes it difficult to perform joining at a low temperature. Thus, solder having the above composition, that is, a composition containing 40% to 65% by weight of In, 0.01% to 5% by weight of Ag, 0.01% to 1% by weight of Cu, and the balance including Sn, is desirably used in order to achieve high ductility, high mechanical strength, and joining at a low temperature. Preferably, solder having a composition containing 47% to 55% by weight of In, 0.1% to 3% by weight of Ag, 0.1% to 0.8% by weight of Cu, and the balance including Sn is used. The solder is desirably Pb-free solder that does not contain lead (Pb).

When solder having the above-described composition is heated to a temperature equal to or higher than the liquidus temperature and the molten solder is cooled to be solidified, the cooling rate at which the molten solder is cooled is preferably set to be relatively high, that is, for example, 1° C./sec. Performing cooling at the relatively high cooling rate suppresses the formation (i.e., crystallization) of intermetallic compounds that are likely to have a large size, such as $Ag_2In$ and $Cu_6(In, Sn)_5$. This increases the likelihood of formation of solder including the fine InAgCu-containing phase dispersed therein.

A second embodiment is described below. The second embodiment describes further detailed examples of an electronic apparatus including the above-described solder and a method for manufacturing such an electronic apparatus.

Figure 15:
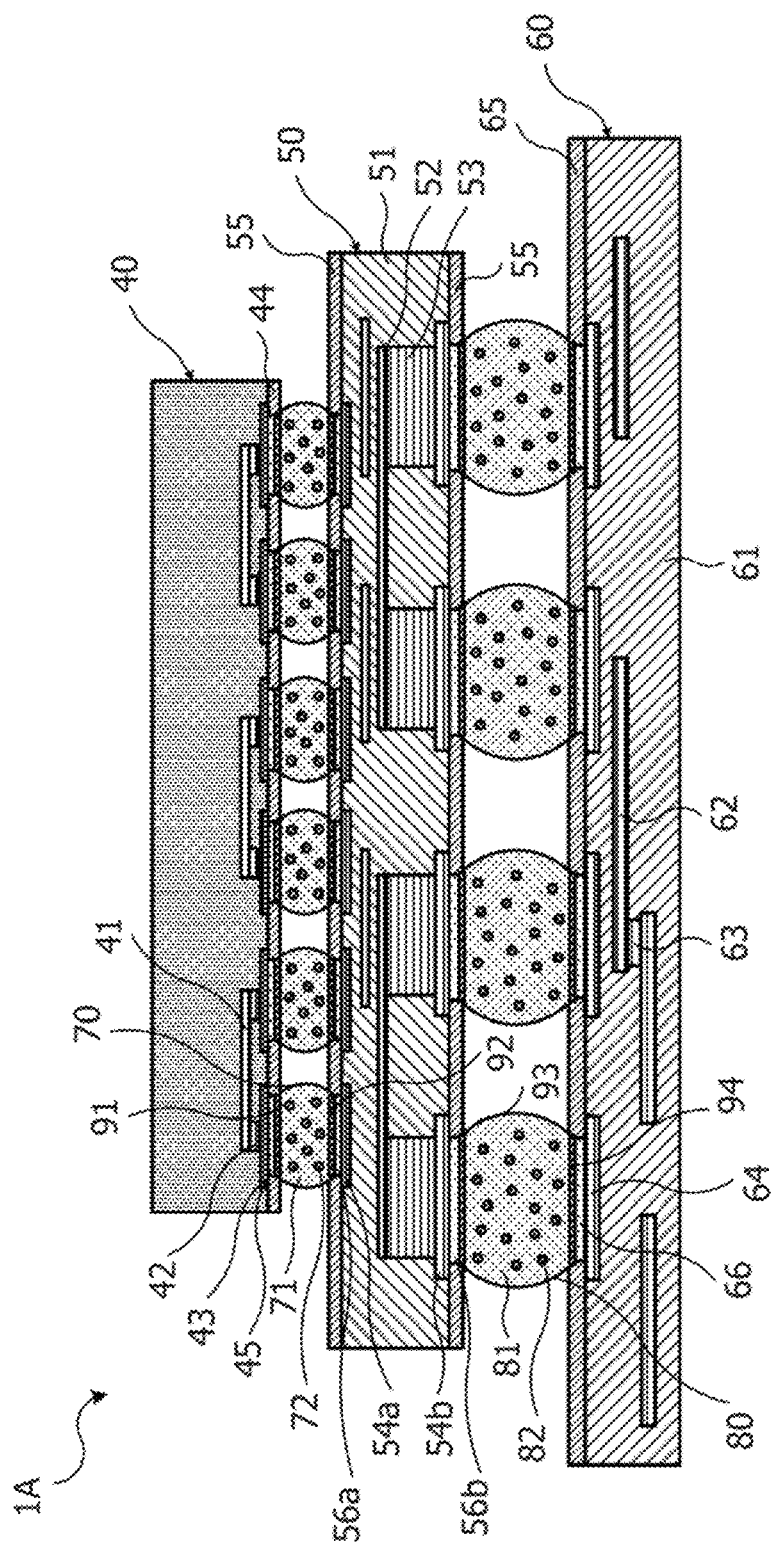
FIG. 15 is a diagram illustrating an example of an electronic apparatus according to a second embodiment.

FIG. 15 illustrates an example of an electronic apparatus according to the second embodiment. FIG. 15 is a schematic cross-sectional view of the electronic apparatus according to the second embodiment. The electronic apparatus 1A illustrated in FIG. 15 includes a semiconductor chip 40, an interposer 50, and a circuit board 60.

The semiconductor chip 40 includes a circuit element (not illustrated) such as a transistor which is formed using a semiconductor substrate; wires 41 and vias 42, which are conductive portions electrically connected to the circuit element; and a plurality of electrode layers 43 that are electrically connected to the respective conductive portions. A protection film 44 is disposed on the surface of the semiconductor chip 40 such that at least a portion of each electrode layer 43 is exposed at the protection film 44. A barrier metal layer 45 is disposed on the surface of each electrode layer 43 exposed at the protection film 44. Thus, the semiconductor chip 40 includes multilayer electrodes each including the electrode layer 43 and the barrier metal layer 45 disposed on the electrode layer 43.

The interposer 50 includes a substrate 51; wires 52 and vias 53, which are conductive portions formed inside the substrate 51; and a plurality of electrode layers 54*a* and electrode layers 54*b* disposed on the front and rear surfaces of the substrate 51, respectively, and electrically connected to the respective internal conductive portions. The electrode layers 54*a*, which are disposed on the front surface of the interposer 50, are each arranged at a position corresponding to the position of the associated one of the electrode layers 43 of the semiconductor chip 40. The electrode layers 54*b*, which are disposed on the rear surface of the interposer 50, are each arranged at a position corresponding to the position of the associated one of electrode layers 64 included in the circuit board 60 described below.

A protection film 55 is disposed on the front and rear surfaces of the interposer 50 such that at least a portion of each electrode layer 54a or electrode layer 54b is exposed at the protection film 55. Barrier metal layers 56a and 56b are disposed on the surface of each electrode layer 54a and the surface of each electrode layer 54b, respectively, that are exposed at the protection film 55. Thus, the interposer 50 includes multilayer electrodes each including the electrode layer 54a and the barrier metal layer 56a disposed on the electrode layer 54a and multilayer electrodes each including the electrode layer 54b and the barrier metal layer 56b disposed on the electrode layer 54b. The interposer 50 may include a printed substrate or may alternatively be an interposer including a semiconductor material, such as a Si interposer.

The circuit board 60 includes a substrate 61; wires 62 and vias 63, which are conductive portions formed inside the substrate 61; and a plurality of electrode layers 64 disposed on the surface of the substrate 61 and electrically connected to the respective internal conductive portions. As described above, the electrode layers 64 of the circuit board 60 are each arranged at the position corresponding to the position of the associated one of the electrode layers 54b disposed on the rear surface of the interposer 50.

A protection film 65 is disposed on the surface of the circuit board 60 such that at least a portion of each electrode layer 64 is exposed at the protection film 65. A barrier metal layer 66 is disposed on the surface of each electrode layer 64 exposed at the protection film 65. Thus, the circuit board 60 includes multilayer electrodes each including the electrode layer 64 and the barrier metal layer 66 disposed on the electrode layer 64. The circuit board 60 may include a printed substrate. The circuit board 60 may further include the electrode layers, the protection film, and the barrier metal layers on the rear surface thereof similarly to the front surface thereof.

The electrode layers 43 of the semiconductor chip 40 are each electrically connected to the associated one of the electrode layers 54a disposed on the front surface of the interposer 50 with solder 70. The solder 70 includes an InSn-containing phase 71 mainly composed of In and Sn and an InAgCu-containing phase 72 mainly composed of In, Ag, and Cu. The InSn-containing phase 71 may further contain Ag, Cu, and the like in addition to the main components, that is, In and Sn. The InAgCu-containing phase 72 may further contain Sn and the like in addition to the main components, that is, In, Ag, and Cu. The InAgCu-containing phase 72 has a structure including $AgIn_2$ and Cu dissolved in $AgIn_2$. The InAgCu-containing phase 72 has a relatively fine size (e.g., 2 μm or less) and dispersed in the InSn-containing phase 71.

An interface layer 91 is disposed at the interface between the solder 70 and the barrier metal layer 45 disposed on each electrode layer 43 of the semiconductor chip 40. The interface layer 91 contains the constituent elements of the solder 70 and the constituent elements of the barrier metal layers 45. An interface layer 92 is disposed at the interface between the solder 70 and the barrier metal layer 56a disposed on each electrode layer 54a of the interposer 50. The interface layer 92 contains the constituent elements of the solder 70 and the constituent elements of the barrier metal layers 56a.

The electrode layers 54b disposed on the rear surface of the interposer 50 are each electrically connected to the associated one of the electrode layers 64 of the circuit board 60 with solder 80. The solder 80 includes an InSn-containing phase 81 mainly composed of In and Sn and an InAgCu-containing phase 82 mainly composed of In, Ag, and Cu. The InSn-containing phase 81 may further contain Ag, Cu, and the like in addition to the main components, that is, In and Sn. The InAgCu-containing phase 82 may further contain Sn and the like in addition to the main components, that is, In, Ag, and Cu. The InAgCu-containing phase 82 has a structure including $AgIn_2$ and Cu dissolved in $AgIn_2$. The InAgCu-containing phase 82 has a relatively fine size (e.g., 2 μm or less) and dispersed in the InSn-containing phase 81.

An interface layer 93 is disposed at the interface between the solder 80 and the barrier metal layer 56b disposed on each electrode layer 54b of the interposer 50. The interface layer 93 contains the constituent elements of the solder 80 and the constituent elements of the barrier metal layers 54b. An interface layer 94 is disposed at the interface between the solder 80 and the barrier metal layer 66 disposed on each electrode layer 64 of the circuit board 60. The interface layer 94 contains the constituent elements of the solder 80 and the constituent elements of the barrier metal layers 66.

An electronic apparatus 1A having the above-described structure is produced by, for example, mounting the semiconductor chip 40 on the interposer 50 and then mounting the interposer 50 including the semiconductor chip 40 on the circuit board 60. The electronic apparatus 1A may also be produced by mounting the circuit board 60 on the interposer 50 and then mounting the interposer 50 including the circuit board 60 on the semiconductor chip 40.

Figure 16A:
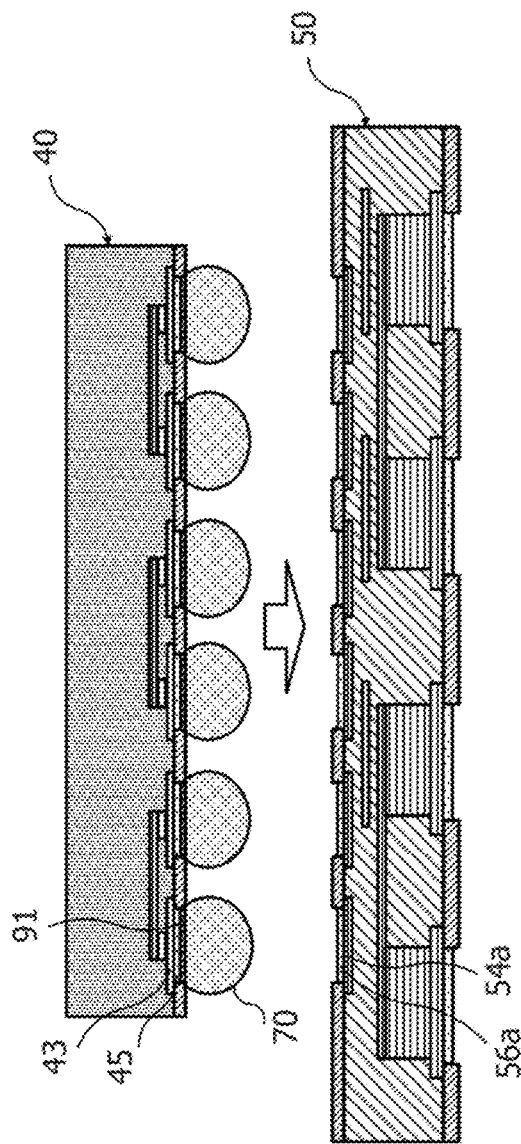
FIGS. 16A and 16B are diagrams illustrating an example of a method for manufacturing an electronic apparatus according to a third embodiment (Part 1)

FIGS. 16A to 17B illustrate an example of a method for manufacturing an electronic apparatus according to a third embodiment. FIGS. 16A and 16B are schematic cross-sectional views of a semiconductor chip and an interposer which illustrate a process for joining the semiconductor chip and the interposer to each other. FIGS. 17A and 17B are schematic cross-sectional views of an interposer and a circuit board which illustrate a process for joining the interposer and the circuit board to each other. FIGS. 16A and 16B illustrate the semiconductor chip and the interposer before and after the semiconductor chip and the interposer are joined to each other, respectively. FIGS. 17A and 17B illustrate the interposer and the circuit board before and after the interposer and the circuit board are joined to each other, respectively.

Figure 16B:
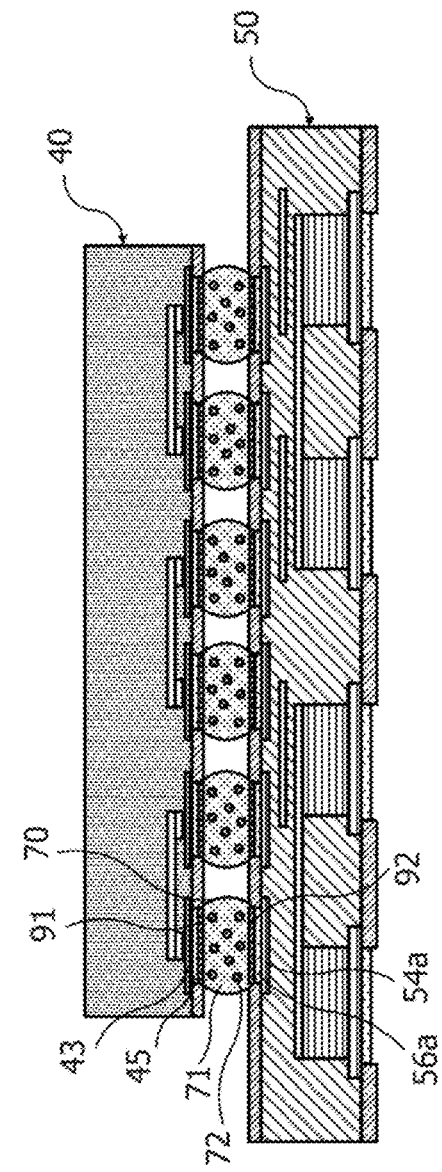

The process for joining a semiconductor chip 40 and an interposer 50 to each other is described below. In the process for joining a semiconductor chip 40 and an interposer 50 to each other as illustrated in FIGS. 16A and 16B, for example, a semiconductor chip 40 including solder 70 deposited thereon and an interposer 50 are prepared as illustrated in FIG. 16A.

The solder 70 may be deposited on the semiconductor chip 40, for example, in accordance with the above-described method illustrated in FIGS. 4A and 4B, that is, by depositing a solder ball or solder paste on the barrier metal layer 45 disposed on each electrode layer 43, performing heating to the temperature at which the solder ball or solder contained in the solder paste melts, and subsequently solidifying the solder ball or the solder contained in the solder paste by cooling. Thus, the semiconductor chip 40 including the solder 70 deposited thereon as illustrated in FIG. 16A may be prepared. When the semiconductor chip 40 including the solder 70 deposited thereon is prepared in this manner, a flux may be deposited on each barrier metal layer 45 or the surfaces of the solder balls or mixed in the solder paste before the solder balls or the solder paste is disposed on each barrier metal layer 45.

The solder contained in the solder balls or the solder paste contains, for example, 40% to 65% by weight of In, 0.01% to 5% by weight of Ag, 0.01% to 1% by weight of Cu, and the balance including Sn. When the solder contained in the solder balls or the solder paste is melted and then solidified, an InSn-containing phase 71 as described above, which is mainly composed of In and Sn, and an InAgCu-containing phase 72 as described above, which is mainly composed of In, Ag, and Cu and dispersed in the InSn-containing phase 71, may be formed depending on the cooling rate at which the solder balls or the solder paste is solidified. When the solder contained in the solder balls or the solder paste is melted and then solidified, an interface layer 91 as described above may be formed between the resulting solder 70 and the barrier metal layers 45 disposed on each electrode layer 43. FIG. 16A illustrates the case where the interface layer 91 is formed.

After the solder 70 is deposited on the semiconductor chip 40, the semiconductor chip 40 is disposed on the interposer 50 as illustrated in FIG. 16A such that the electrode layers 43 (i.e., the barrier metal layers 45 disposed on the electrode layers 43 and the solder 70 deposited on the barrier metal layers 45) are each aligned with the associated one of the electrode layers 54a (i.e., the barrier metal layers 56a disposed on the electrode layers 54a). While the solder 70 deposited on the barrier metal layers 45 of the semiconductor chip 40 is in contact with the barrier metal layers 56a of the interposer 50, heating is performed to a temperature at which the solder 70 melts, and the solder 70 is subsequently solidified by being cooled. Thus, the structure illustrated in FIG. 16B is formed.

When the solder is melted and then solidified, controlling the cooling rate at which the solder 70 is solidified enables the solder 70 including the InSn-containing phase 71 mainly composed of In and Sn and the InAgCu-containing phase 72 mainly composed of In, Ag, and Cu and dispersed in the InSn-containing phase 71 to be formed. For example, performing cooling from a temperature equal to or higher than the liquidus curve to a temperature (e.g., about 100° C.) lower than the melting point of the solder 70 at a cooling rate of 1° C./sec suppresses the crystallization of coarse intermetallic compounds, which enables the solder 70 including the InSn-containing phase 71 and the fine InAgCu-containing phase 72 dispersed in the InSn-containing phase 71 to be formed. The solder 70 contains 40% to 65% by weight of In, 0.01% to 5% by weight of Ag, 0.01% to 1% by weight of Cu, and the balance including Sn.

When the solder is melted and then solidified, an interface layer 92 is formed between the resulting solder 70 and the barrier metal layer 56a disposed on each electrode layer 54a of the interposer 50. The interface layer 91, which is disposed between the solder 70 and the barrier metal layer 45 disposed on each electrode layer 43 of the semiconductor chip 40, may also be formed when the solder is melted and then solidified.

Through the above-described process, the electrode layers 43 of the semiconductor chip 40 are joined to the solder 70 with the barrier metal layers 45 and the interface layer 91 interposed between the electrode layers 43 and the solder 70, and the electrode layers 54a of the interposer 50 are joined to the solder 70 with the barrier metal layers 56a and the interface layer 92 interposed between the electrode layers 54a and the solder 70 as illustrated in FIG. 16B. Thus, the semiconductor chip 40 and the interposer 50 are electrically connected to each other with the solder 70.

While FIGS. 16A and 16B illustrate an example case where the semiconductor chip 40 including the solder 70 deposited thereon and the interposer 50 are prepared and joined to each other, it is also possible to prepare and join an interposer 50 including solder 70 deposited thereon and a semiconductor chip 40 to each other.

The process for joining an interposer 50 and a circuit board 60 to each other is described below. In the process for joining an interposer 50 and a circuit board 60 to each other as illustrated in FIGS. 17A and 17B, for example, an interposer 50 including solder 80 deposited thereon and a circuit board 60 are prepared as illustrated in FIG. 17A. The interposer 50 may include the semiconductor chip 40 that has been mounted thereon by the above-described process illustrated in FIGS. 16A and 16B.

The solder 80 may be deposited on the interposer 50, for example, in accordance with the above-described method illustrated in FIGS. 4A and 4B, that is, by depositing a solder ball or solder paste on the barrier metal layer 56b disposed on each electrode layer 54b, performing heating to the temperature at which the solder ball or solder contained in the solder paste melts, and subsequently solidifying the solder ball or the solder contained in the solder paste by cooling. Thus, the interposer 50 including the solder 80 deposited thereon as illustrated in FIG. 17A may be prepared. When the interposer 50 including the solder 80 deposited thereon is prepared in this manner, a flux may be deposited on each barrier metal layer 56b or the surfaces of the solder balls or mixed in the solder paste before the solder balls or the solder paste is disposed on the barrier metal layers 56b.

The solder contained in the solder balls or the solder paste contains, for example, 40% to 65% by weight of In, 0.01% to 5% by weight of Ag, 0.01% to 1% by weight of Cu, and the balance including Sn. When the solder contained in the solder balls or the solder paste is melted and then solidified, an InSn-containing phase 81 as described above, which is mainly composed of In and Sn, and an InAgCu-containing phase 82 as described above, which is mainly composed of In, Ag, and Cu and dispersed in the InSn-containing phase 81, may be formed depending on the cooling rate at which the solder balls or the solder paste is solidified. When the solder contained in the solder balls or the solder paste is melted and then solidified, an interface layer 93 may be formed between the resulting solder 80 and the barrier metal layer 56b disposed on each electrode layer 54b. FIG. 17A illustrates the case where the interface layer 93 is formed.

After the solder 80 is deposited on the interposer 50, the interposer 50 is disposed on the circuit board 60 as illustrated in FIG. 17A such that the electrode layers 54b (i.e., the barrier metal layers 56b disposed on the electrode layers 54b and the solder 80 deposited on the barrier metal layers 56b) are each aligned with the associated one of the electrode layers 64 (i.e., the barrier metal layers 66 disposed on the electrode layers 64). while the solder 80 deposited on the barrier metal layers 56b of the interposer 50 is in contact with the barrier metal layers 66 of the circuit board 60, heating is performed to a temperature at which the solder 80 melts, and the solder 80 is subsequently solidified by being cooled. Thus, the structure illustrated in FIG. 17B is formed.

When the solder is melted and then solidified, controlling the cooling rate at which the solder 80 is solidified enables the solder 80 including the InSn-containing phase 81 mainly composed of In and Sn and the InAgCu-containing phase 82 mainly composed of In, Ag, and Cu and dispersed in the InSn-containing phase 81 to be formed. For example, performing cooling from a temperature equal to or higher than the liquidus curve to a temperature (e.g., about 100° C.) lower than the melting point of the solder 80 at a cooling rate of 1° C./sec suppresses the crystallization of coarse intermetallic compounds, which enables the solder 80 including the InSn-containing phase 81 and the fine InAgCu-containing phase 82 dispersed in the InSn-containing phase 81 to be formed. The solder 80 contains 40% to 65% by weight of In, 0.01% to 5% by weight of Ag, 0.01% to 1% by weight of Cu, and the balance including Sn.

When the solder is melted and then solidified, an interface layer 94 is formed between the resulting solder 80 and the barrier metal layer 66 disposed on each electrode layer 64 of the circuit board 60. The interface layer 93, which is disposed between the solder 80 and the barrier metal layer 56b disposed on each electrode layer 54b of the interposer 50, may also be formed when the solder is melted and then solidified.

Through the above-described process, the electrode layers 54b of the interposer 50 are joined to the solder 80 with the barrier metal layers 56b and the interface layer 93 interposed between the electrode layers 54b and the solder 80, and the electrode layers 64 of the circuit board 60 are joined to the solder 80 with the barrier metal layers 66 and the interface layer 94 interposed between the electrode layers 64 and the solder 80 as illustrated in FIG. 17B. Thus, the interposer 50 and the circuit board 60 are electrically connected to each other with the solder 80.

The electronic apparatus 1A illustrated in FIG. 15 may be produced by, for example, mounting the semiconductor chip 40 on the interposer 50 by the above-described method illustrated in FIGS. 16A and 16B and then mounting the resulting interposer 50 on the circuit board 60 by the above-described method illustrated in FIGS. 17A and 17B. The electronic apparatus 1A illustrated in FIG. 15 may also be produced by mounting the interposer 50 on the circuit board 60 by the above-described method illustrated in FIGS. 17A and 17B and then mounting the semiconductor chip 40 on the resulting interposer 50 by the above-described method illustrated in FIGS. 16A and 16B.

While FIGS. 17A and 17B illustrate an example case where the interposer 50 including the solder 80 deposited thereon and the circuit board 60 are prepared and joined to each other, it is also possible to prepare and join the circuit board 60 including the solder 80 deposited thereon and the interposer 50 to each other.

In the electronic apparatus 1A, the semiconductor chip 40 and the interposer 50 are joined to each other with the solder 70 including the InSn-containing phase 71 and the InAgCu-containing phase 72 dispersed in the InSn-containing phase 71, and the interposer 50 and the circuit board 60 are joined to each other with the solder 80 including the InSn-containing phase 81 and the InAgCu-containing phase 82 dispersed in the InSn-containing phase 81. The solders 70 and 80 have high ductility and a high mechanical strength as described in the first embodiment above. Therefore, in the electronic apparatus 1A, the durability of the joint between the semiconductor chip 40 and the interposer 50 and the durability of the joint between the interposer 50 and the circuit board 60 are high.

The solders 70 and 80 may have the same or substantially the same composition. The solders 70 and 80 may also have different compositions. In the case where the solders 70 and 80 have the same or substantially the same composition, the solders 70 and 80 may have the same or substantially the same melting point. In such a case, the process for joining the semiconductor chip 40 and the interposer 50 to each other and the process for joining the interposer 50 and the circuit board 60 to each other may be performed under the same conditions. This makes it easier to produce the electronic apparatus 1A.

In the case where the solders 70 and 80 have different compositions, the solders 70 and 80 may have different melting points and it becomes possible to control the melting points (i.e., joint temperatures) of the solders 70 and 80 such that the solder 70 (or, the solder 80) formed in the former joining process is not melted when the solder 80 (or, the solder 70) is formed in the latter joining process. In such a case, it is possible to keep the solder 70 (or, the solder 80) formed in the former joining process from being melted and fluidized and thereby causing short-circuiting to occur in the latter joining process even when the intervals between the adjacent solder joints are small.

While the above-described embodiment describes an example case where the semiconductor chip 40, the interposer 50, and the circuit board 60 are joined to one another, it is possible to join various types of electronic components, such as semiconductor chips, semiconductor packages, and a semiconductor chip and a semiconductor package, to each other in the above-described manner.

Solder materials that achieve high electrical connectivity, high workability, and high productivity have been widely used for joining electronic components to each other. Recently, Pb-free solder materials have been commonly used with consideration given to the environmental issues. In particular, Sn—Ag solder materials and Sn—Ag—Cu solder materials have been widely used. Since these Pb-free solder materials have a higher melting point than those containing Pb, the temperature to which the solder materials are heated to be melted for performing joining is accordingly increased. For example, a method in which reflowing of a solder material is performed at 200° C. or more in order to perform joining has been widely employed. However, an increase in the melting point of a solder material, which increases the reflow temperature of the solder material, may cause, for example, the stress that occurs at a solder joint to be increased and the electronic component to be joined to be curled due to the thermal expansion coefficient of a material constituting the electronic component. In order to address these issues, for example, using Sn—Bi eutectic solder containing Sn and bismuth (Bi) reduces the reflow temperature to about 180° C. and enables joining to be performed at a low temperature, which reduces the production cost.

High-performance computers such as server computers which include various types of electronic components mounted thereon would be desired to have a further high information-processing capability and a further high information-transmission capability in future. However, it may be difficult to address, by developing the electrical wiring technology, an increase in power consumption which may be caused due to the improvements of information-processing capability and information-transmission capability. One of the countermeasures to address the above issue is to employ a technique in which optical components and optical wires are used.

In contrast to electrical wiring, optical wiring enables a loss on a transmission line to be reduced even when the transmission speed is increased. Thus, it becomes possible to achieve high speed transmission and energy conservation. However, materials used for manufacturing the optical components and optical wires have low heat resistance. For example, optical adhesives have a glass-transition point lower than the common reflow temperature in many cases. Therefore, if an optical adhesive is subjected to a temperature condition where reflowing occurs, the optical adhesive may become deteriorated and, as a result, the position of an optical component fixed in place using the optical adhesive may be changed. Thus, a further reduction in the reflow temperature is anticipated in the production of an electronic apparatus in which a solder material or the above-described material having low heat resistance is used.

In—Sn eutectic solder having a melting point of about 117° C., which is lower than that of Sn—Bi eutectic solder, is one of the materials that may lower the reflow temperature. However, since In—Sn eutectic solder has high ductility but a low mechanical strength, it may be difficult to enhance the durability of the solder joint to a sufficient degree using the In—Sn eutectic solder.

Examples of other low-melting-point solder materials include Sn—Bi—Pb solder materials, Bi—Pb solder materials, and In—Cd solder materials containing In and cadmium (Cd). However, these low-melting-point solder materials, which all include hazardous elements such as Pb and Cd, are unsuitable as a material used for joining electronic apparatuses to each other. It is also possible to lower the melting point of solder by adding gallium (Ga) to the solder. However, adding Ga to solder lowers the solidus temperature to a temperature in the vicinity of the room temperature. In such a case, the solder may be melted in the operating environment of the electronic apparatus. Therefore, solder containing Ga is also unsuitable as a material used for joining components of an electronic apparatus to each other.

From the above-described viewpoints, increasing the mechanical strength of an In—Sn solder material while limiting the degradation of the ductility thereof is considered to be an effective approach. Thus, a solder material produced by adding Ag and Cu to In—Sn solder, which is described in the first and second embodiments above, is used. The contents of Sn, In, Ag, and Cu in the solder material may be each set to be within the predetermined range described above.

This solder material has a melting point in a low-temperature range of about 108° C. to 117° C. Reflowing the solder material causes a structure in which a fine phase (e.g., having a size of 2 μm or less) containing In, Ag, and Cu is dispersed to be formed in the solder. This structure enables a solder joint having high ductility and a high mechanical strength to be formed and, as a result, an electronic apparatus including components being joined to each other at a low temperature with high durability may be produced. Since the solder material enables joining to be performed at a low temperature, the solder material may also be suitably used for manufacturing an electronic apparatus composed of low-heat-resistant materials.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic apparatus comprising:
   a first electronic component including a first electrode;
   solder on the first electrode, the solder includes
      an InSn-containing phase, and
      an Ag-In intermetallic compound dispersed in the InSn-containing phase,
   wherein the Ag-In intermetallic compound has a structure in which Cu is dissolved in $AgIn_2$.

2. The electronic apparatus according to claim 1, wherein the solder contains 40% to 65% by weight of In.

3. The electronic apparatus according to claim 2,
   wherein the solder further contains
   Sn,
   0.01% to 5% by weight of Ag, and
   0.01% to 1% by weight of Cu.

4. The electronic apparatus according to claim 1, further comprising:
   a second electronic component including a second electrode electrically connected to the first electrode with the solder.

5. A method for manufacturing an electronic apparatus, the method comprising:
   forming solder on a first electrode of a first component, the solder including
      an InSn-containing phase and
      an Ag-In intermetallic compound dispersed in the InSn-containing phase,
   wherein the Ag-In intermetallic compound has a structure in which Cu is dissolved in $AgIn_2$.

6. The method for manufacturing an electronic apparatus according to claim 5,
   wherein the solder contains 40% to 65% by weight of In.

7. The method for manufacturing an electronic apparatus according to claim 6,
   wherein the solder contains Sn,
   0.01% to 5% by weight of Ag, and
   0.01% to 1% by weight of Cu.

8. The method for manufacturing an electronic apparatus according to claim 5,
   wherein the solder including the Ag-In intermetallic compound is formed on the first electrode by
   depositing a material containing Sn, In, Ag, and Cu on the first electrode, and
   melting and subsequently solidifying the material.

9. The method for manufacturing an electronic apparatus according to claim 5,
   wherein the solder including the Ag-In intermetallic compound is formed on the first electrode by
   depositing a material containing Sn, In, Ag, and Cu on the first electrode, and
   melting and subsequently solidifying the material, and
   wherein the solder is electrically connected to a second electrode disposed on a second electronic component.

10. The method for manufacturing an electronic apparatus according to claim 9,
   wherein the material is brought into contact with the second electrode of the second electronic component after being deposited on the first electrode of the first electronic component, and
   wherein the material is melted and subsequently solidified in order to form the solder including the Ag-In intermetallic compound and to connect the first electrode to the second electrode with the solder.

* * * * *